(12) United States Patent
Kim

(10) Patent No.: US 11,862,574 B2
(45) Date of Patent: Jan. 2, 2024

(54) FAN-OUT SEMICONDUCTOR PACKAGE

(71) Applicant: SAMSUNG ELECTRONICS CO., LTD., Suwon-si (KR)

(72) Inventor: Jung Soo Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 141 days.

(21) Appl. No.: 17/369,413

(22) Filed: Jul. 7, 2021

(65) Prior Publication Data

US 2021/0343659 A1 Nov. 4, 2021

Related U.S. Application Data

(63) Continuation of application No. 15/891,529, filed on Feb. 8, 2018, now Pat. No. 11,075,171.

(30) Foreign Application Priority Data

Nov. 1, 2017 (KR) .......................... 10-2017-0144900

(51) Int. Cl.
*H01L 23/48* (2006.01)
*H01L 23/00* (2006.01)
(Continued)

(52) U.S. Cl.
CPC ........ *H01L 23/562* (2013.01); *H01L 23/3114* (2013.01); *H01L 23/3128* (2013.01);
(Continued)

(58) Field of Classification Search
CPC ... H01L 23/3114; H01L 23/562; H01L 24/20; H01L 2924/15174; H01L 2924/3511
(Continued)

(56) References Cited

U.S. PATENT DOCUMENTS 6,114,763 A * 9/2000 Smith ................ H05K 1/112
257/E23.101
8,115,292 B2 * 2/2012 Toh ................... H01L 23/3128
257/777
(Continued)

FOREIGN PATENT DOCUMENTS

CN 105514087 A 4/2016
CN 106935556 A 7/2017
(Continued)

OTHER PUBLICATIONS

Communication dated Sep. 5, 2022 issued by the Chinese Patent Office in Chinese Patent Application No. 201810399846.5.
(Continued)

*Primary Examiner* — Nitin Parekh
(74) *Attorney, Agent, or Firm* — Sughrue Mion, PLLC

(57) ABSTRACT

A fan-out semiconductor package includes a core member having a through hole, at least one dummy structure disposed in the core member, a semiconductor chip disposed in the through hole and including an active surface on which a connection pad is disposed and an inactive surface opposing the active surface, an encapsulant sealing at least a portion of each of the core member and the semiconductor chip, and filing at least a portion of the through hole, and a connection member disposed on the core member and the active surface of the semiconductor chip, and including a redistribution layer electrically connected to the connection pad.

20 Claims, 20 Drawing Sheets

(51) Int. Cl.
  *H01L 23/498* (2006.01)
  *H01L 23/31* (2006.01)
  *H01L 21/56* (2006.01)

(52) U.S. Cl.
  CPC ........ *H01L 23/49816* (2013.01); *H01L 24/09* (2013.01); *H01L 24/17* (2013.01); *H01L 24/19* (2013.01); *H01L 24/20* (2013.01); *H01L 21/568* (2013.01); *H01L 24/13* (2013.01); *H01L 2224/118* (2013.01); *H01L 2224/13101* (2013.01); *H01L 2224/18* (2013.01); *H01L 2224/73204* (2013.01); *H01L 2924/1431* (2013.01); *H01L 2924/1433* (2013.01); *H01L 2924/1436* (2013.01); *H01L 2924/15174* (2013.01); *H01L 2924/15311* (2013.01); *H01L 2924/181* (2013.01); *H01L 2924/18162* (2013.01); *H01L 2924/3511* (2013.01)

(58) Field of Classification Search
  USPC .......................................................... 257/695
  See application file for complete search history.

(56) References Cited

U.S. PATENT DOCUMENTS

| | | | |
|---|---|---|---|
| 8,263,439 | B2 | 9/2012 | Marimuthu et al. |
| 8,829,663 | B2* | 9/2014 | Pohl .................... H01L 21/6835 257/730 |
| 9,437,583 | B1 | 9/2016 | Shih et al. |
| 9,570,418 | B2 | 2/2017 | Chen et al. |
| 9,793,246 | B1 | 10/2017 | Tseng et al. |
| 9,831,195 | B1 | 11/2017 | Lu |
| 10,177,032 | B2 | 1/2019 | Chen et al. |
| 2006/0128069 | A1 | 6/2006 | Hsu |
| 2006/0207088 | A1 | 9/2006 | Yamano |
| 2008/0149381 | A1 | 6/2008 | Kawagishi et al. |
| 2008/0237828 | A1 | 10/2008 | Yang |
| 2009/0243065 | A1* | 10/2009 | Sugino ................ H01L 23/3128 257/E23.116 |
| 2009/0309212 | A1 | 12/2009 | Shim et al. |
| 2011/0204505 | A1* | 8/2011 | Pagaila ............. H01L 23/49816 438/109 |
| 2012/0013021 | A1* | 1/2012 | Kobayashi .............. H01L 24/19 257/E21.597 |
| 2013/0249115 | A1 | 9/2013 | Lin et al. |
| 2013/0307140 | A1* | 11/2013 | Huang ................ H01L 23/3128 257/737 |
| 2014/0103527 | A1 | 4/2014 | Marimuthu et al. |
| 2014/0252573 | A1 | 9/2014 | Lin et al. |
| 2014/0321084 | A1 | 10/2014 | Lee et al. |
| 2015/0062850 | A1 | 3/2015 | Choi et al. |
| 2015/0187742 | A1* | 7/2015 | Kwon ..................... H01L 24/24 438/126 |
| 2016/0049363 | A1 | 2/2016 | Cheng et al. |
| 2016/0093572 | A1 | 3/2016 | Chen |
| 2016/0118333 | A1 | 4/2016 | Lin |
| 2016/0233166 | A1* | 8/2016 | Teh ..................... H01L 23/5389 |
| 2016/0260695 | A1 | 9/2016 | Chung et al. |
| 2016/0338202 | A1 | 11/2016 | Park et al. |
| 2017/0040265 | A1 | 2/2017 | Park et al. |
| 2017/0092510 | A1 | 3/2017 | Oh et al. |
| 2017/0194266 | A1 | 7/2017 | Kwon et al. |
| 2017/0263470 | A1 | 9/2017 | Lin et al. |
| 2017/0278766 | A1 | 9/2017 | Kim et al. |
| 2018/0151502 | A1 | 5/2018 | Lin et al. |
| 2018/0350747 | A1 | 12/2018 | Hwang et al. |

FOREIGN PATENT DOCUMENTS

| | | |
|---|---|---|
| CN | 107230666 A | 10/2017 |
| JP | 2006-261245 A | 9/2006 |
| JP | 2010-034390 A | 2/2010 |
| JP | 2016-213466 A | 12/2016 |
| JP | 2017-175123 A | 9/2017 |
| KR | 10-2015-0028031 A | 3/2015 |
| KR | 10-2016-0132763 A | 11/2016 |
| WO | 2010041621 A1 | 4/2010 |
| WO | 2014162478 A1 | 10/2014 |

OTHER PUBLICATIONS

Communication dated Feb. 21, 2019 issued by the Taiwanese Patent Office in counterpart Taiwanese Application No. 107105183.
Communication dated Jan. 15, 2019 issued by the Japanese Patent Office in counterpart Japanese Application No. 2018-029727.
Korean Office Action issued in corresponding Korean Patent Application No. 10-2017-0144900, dated May 31, 2018, with English Translation.

* cited by examiner

II-II'

FAN-OUT SEMICONDUCTOR PACKAGE

CROSS-REFERENCE TO RELATED APPLICATION(S)

This application is a continuation of U.S. application Ser. No. 15/891,529, filed Feb. 8, 2018, which claims benefit of priority to Korean Patent Application No. 10-2017-0144900, filed on Nov. 1, 2017, in the Korean Intellectual Property Office, the disclosures of which are incorporated herein by reference in their entirety.

TECHNICAL FIELD

The present disclosure relates to a semiconductor package, and more particularly, to a fan-out semiconductor package in which an electric connection structure may extend beyond a region in which a semiconductor chip is disposed.

BACKGROUND

A principal trend in the technical development of semiconductor chips has been reducing the size of components. Thus, in the field of packaging, a plurality of pins have been required to be implemented, while being miniaturized, according to a rapid increase in demand for small-sized semiconductor chips and the like.

A fan-out semiconductor package has been proposed as a type of packaging technology, to meet such demand. In the case of such a fan-out semiconductor package, connection terminals may also be redistributed beyond a region in which a semiconductor chip is disposed, such that a plurality of pins may be implemented while being miniaturized.

SUMMARY

An aspect of the present disclosure is to provide a fan-out semiconductor package having a novel structure in which occurrence of warpage may be effectively reduced.

According to an aspect of the present disclosure, a package may be supported in a region encapsulating a semiconductor chip, and a core member in which a distribution layer may be designed as required may be disposed. One or more dummy structures are disposed in the core member.

According to an aspect of the present disclosure, a fan-out semiconductor package includes a core member having a through hole, at least one dummy structure disposed in the core member, a semiconductor chip disposed in the through hole, and including an active surface on which a connection pad is disposed and an inactive surface opposing the active surface, an encapsulant sealing at least a portion of each of the core member and the semiconductor chip, and filling at least a portion of the through hole, and a connection member disposed on the core member and the active surface of the semiconductor chip, and including a redistribution layer electrically connected to the connection pad. The dummy structure is electrically insulated from the semiconductor chip.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
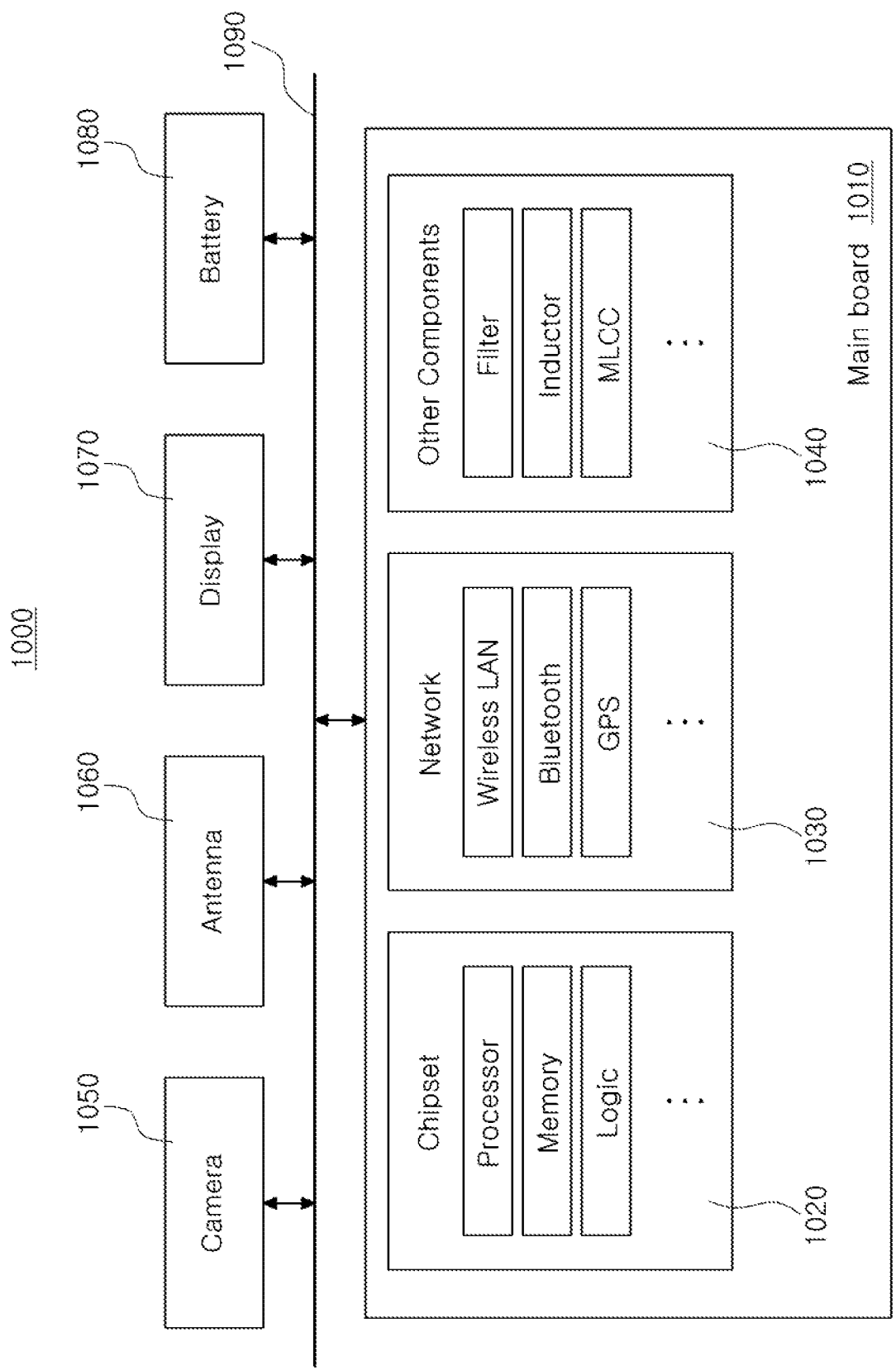
FIG. 1 is a block diagram schematically illustrating an example of an electronic device system.

Hereinafter, exemplary embodiments of the present disclosure will be described with reference to the accompanying drawings. The shape and size of constituent elements in the drawings may be exaggerated or reduced for clarity.

Electronic Device

FIG. 1 is a schematic block diagram of an example of an electronic device system.

Referring to FIG. 1, an electronic device 1000 may accommodate a main board 1010 therein. In the main board 1010, chip-related components 1020, network-related components 1030, other components 1040, and the like may be physically and/or electrically connected to one another, and may also be combined with other components to be described later to thus form various signal lines 1090.

Examples of the chip-related components 1020 may include a memory chip such as a volatile memory, for example, a dynamic random access memory (DRAM), a non-volatile memory, for example, a read only memory (ROM), a flash memory, and the like; an application processor chip such as a central processor, for example, a central processing unit (CPU), a graphics processor, for example, a graphics processing unit (GPU), a digital signal processor, a cryptographic processor, a microprocessor, a microcontroller, and the like; a logic chip such as an analog-to-digital converter, an application-specific IC (ASIC), and the like; and the like, but are not limited thereto. Thus, different types of chip-related components may also be included therein. In addition, the chip-related components 1020 may also be combined with each other.

Examples of the network-related components 1030 may include Wi-Fi (IEEE 802.11 family and the like), WiMAX (IEEE 802.16 family and the like), IEEE 802.20, long term evolution (LTE), Ev-DO, HSPA+, HSDPA+, HSUPA+, EDGE, GSM, GPS, GPRS, CDMA, TDMA, DECT, Bluetooth, 3G, 4G, 5G, and other optional wireless and wired protocols provided thereafter, but are not limited thereto. In addition, any ones of a number of other wireless or wired standards or protocols may be included therein. Further, the network-related components 1030 may also be combined with the chip-related components 1020.

Examples of other components 1040 may include a high-frequency inductor, a ferrite inductor, a power inductor, a ferrite bead, low temperature co-firing ceramics (LTCC), an electro-magnetic interference (EMI) filter, and a multilayer ceramic condenser (MLCC), and the like, but are not limited thereto. In addition, passive components having various other usages, and the like, may be included therein. In addition, other components 1040 may also be combined with the chip-related components 1020 and/or the network-related components 1030.

Depending on the type of the electronic device 1000, the electronic device 1000 may include other components that may or may not be physically and/or electrically connected to the main board 1010. Examples of other components may include, for example, a camera 1050, an antenna 1060, a display 1070, a battery 1080, an audio codec (not shown), a video codec (not shown), a power amplifier (not shown), a compass (not shown), an accelerometer (not shown), a gyroscope (not shown), a speaker (not shown), a large capacity storage device, for example a hard disk drive (not shown), a compact disc (CD) drive (not shown), a digital versatile disk (DVD) drive (not shown), and the like, but are not limited thereto. In addition, other components used for various usages, and the like, may be included therein, depending on the type of the electronic device 1000.

The electronic device 1000 may be a smartphone, a personal digital assistant, a digital video camera, a digital still camera, a network system, a computer, a monitor, a tablet PC, a laptop computer, a netbook computer, a television set, a video game, a smartwatch, an automotive component, or the like, but is not limited thereto. In addition, other optional electronic devices for the processing of data may also be used.

Figure 2:
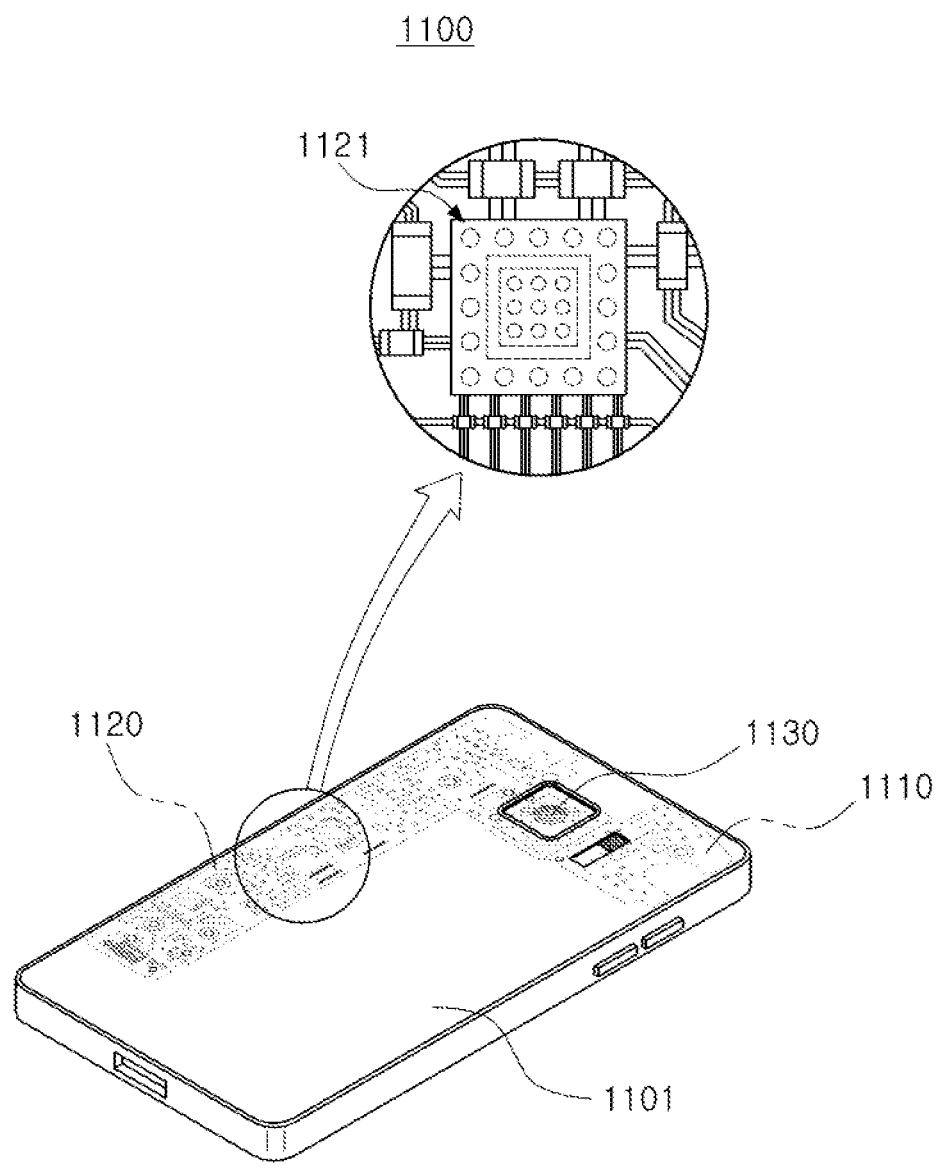
FIG. 2 is a perspective view schematically illustrating an example of an electronic device.

FIG. 2 is a schematic perspective view of an example of an electronic device.

Referring to FIG. 2, a semiconductor package may be used in various electronic devices as described above, for various usages. For example, a motherboard 1110 may be accommodated within a body 1101 of a smartphone 1100, and various components 1120 may be physically and/or electrically connected to the motherboard 1110. In addition, other components, such as a camera 1130 and the like, which may or may not be physically and/or electrically connected to the motherboard 1110, may be accommodated within the body 1101. A portion of the components 1120 may be chip-related components, for example, a semiconductor package 1121, but are not limited thereto. The electronic device is not necessarily limited to the smartphone 1100, but may also be another electronic device as described above.

Semiconductor Package

A semiconductor chip generally has a large number of microelectronic circuits integrated therein, but may not serve as a finished semiconductor product in itself and may be damaged by external physical or chemical impacts. Thus, a semiconductor chip itself may not be used as it is, but may be packaged and used in electronic devices and the like in a package state.

Semiconductor packaging may be required due to a difference in circuit widths between a semiconductor chip and a main board of an electronic device in terms of electrical connectivity. In detail, in the case of the semiconductor chip, the size of a connection pad and a distance between the connection pads are very fine, while in the case of the main board used in electronic devices, the size of a component mounting pad and a distance between component mounting pads may be significantly large, as compared to the scale of the semiconductor chip. Thus, it may be difficult to directly mount a semiconductor chip on such a main board, and thus, a packaging technology in which a difference in circuit widths thereof may be reduced may be required.

Semiconductor packages manufactured in such a packaging technique may be classified as fan-in semiconductor packages and fan-out semiconductor packages, depending on structures and usage thereof.

Hereinafter, a fan-in semiconductor package and a fan-out semiconductor package will be described in more detail with reference to the accompanying drawings.

Fan-in Semiconductor Package

Figure 3B:
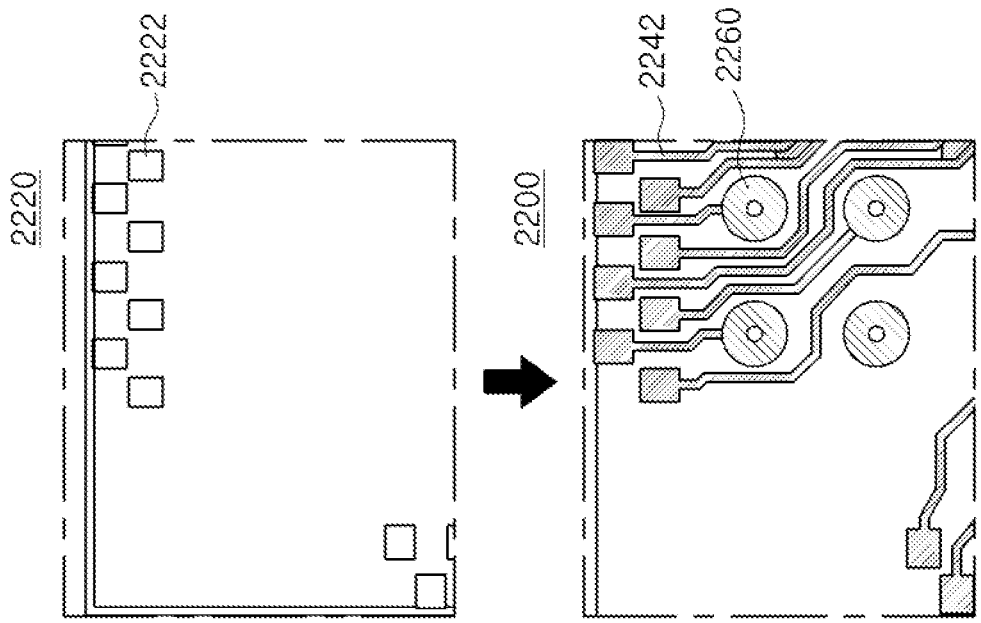
FIGS. 3A and 3B are cross-sectional view schematically illustrating a fan-in semiconductor package before and after packaging.
Figure 3A:
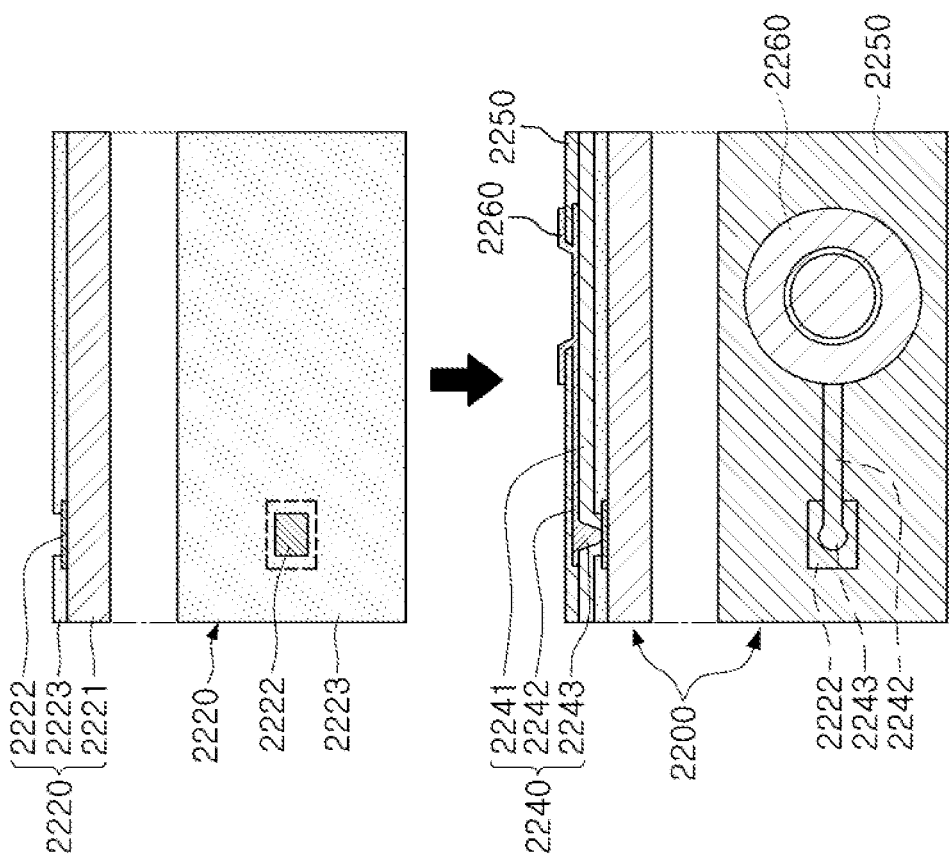

FIGS. 3A and 3B are schematic cross-sectional views of a fan-in semiconductor package before and after packaging.

Figure 4:
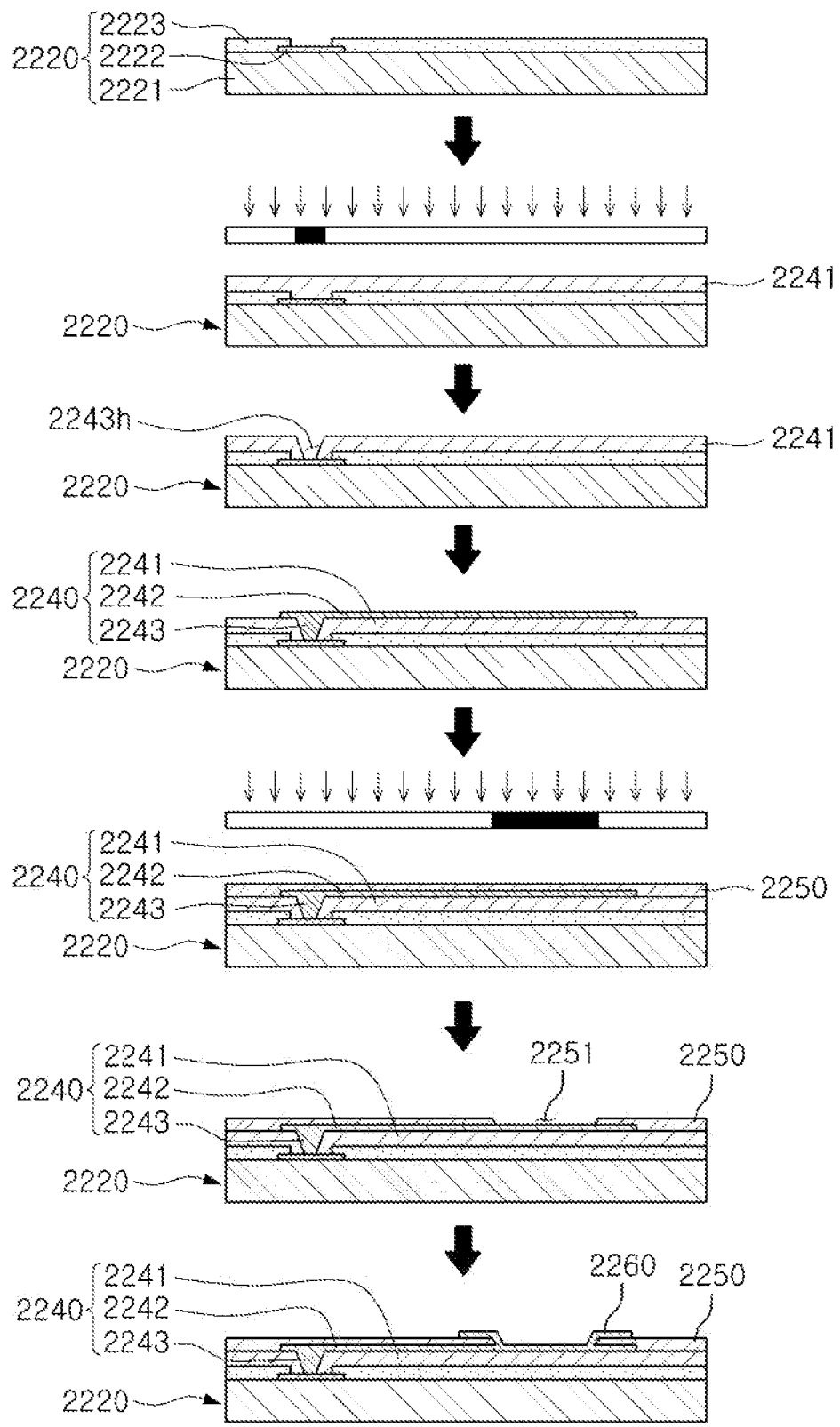
FIG. 4 is cross-sectional views schematically illustrating a packaging process of a fan-in semiconductor package.

FIG. 4 is a schematic cross-sectional view of a packaging process of a fan-in semiconductor package.

With reference to FIGS. 3A to 4, a semiconductor chip 2220 may be an integrated circuit (IC) in a bare state, including a body 2221 including silicon (Si), germanium (Ge), gallium arsenide (GaAs), and the like, a connection pad 2222 formed on one surface of the body 2221 and including a conductive material of aluminum (Al) or the like, and a passivation film 2223, such as an oxide film, a nitride film, or the like, formed on one surface of the body 2221 and covering at least a portion of the connection pad 2222. In this case, since the connection pad 2222 is significantly small, the integrated circuit (IC) may be difficult to be mounted on a medium-sized printed circuit board (PCB) as well as on a main board of an electronic device and the like.

Thus, a connection member 2240 may be formed on the semiconductor chip 2220, to comply with a size of the semiconductor chip 2220, to redistribute the connection pad 2222. The connection member 2240 may be formed by forming an insulating layer 2241 using an insulating material such as a photoimageable dielectric (PID) resin on the semiconductor chip 2220, forming a via hole 2243h exposing the connection pad 2222, and then forming a distribution pattern 2242 and a via 2243. Then, a passivation layer 2250 may be formed to protect the connection member 2240, an opening 2251 may be formed, and then, an under-bump metal layer 2260 and the like may be formed. In detail, through a series of processes, a fan-in semiconductor package 2200 including, for example, the semiconductor chip 2220, the connection member 2240, the passivation layer 2250, and the under-bump metal layer 2260 may be manufactured.

As described above, the fan-in semiconductor package may be a package type in which connection pads of a semiconductor chip, for example, input/output (I/O) terminals are all disposed inside the device, and the fan-in semiconductor package may have appropriate electrical characteristics and relatively low manufacturing costs. Thus, a number of devices for smartphones have been manufactured in the form of a fan-in semiconductor package, and in detail, fan-in semiconductor packages are being developed to realize compactness and fast signal transmission.

However, in the case of the fan-in semiconductor package, space limitations, meaning that all of I/O terminals should be disposed inside the semiconductor chip, may be problematic. Thus, such a structure may be difficult to be applied to a semiconductor chip having a relatively large number of I/O terminals or a semiconductor chip having a relatively small size. In addition, due to such vulnerability, the fan-in semiconductor package may not be directly mounted on a main board of an electronic device. For example, even in a case in which the size of and distance between the I/O terminals of the semiconductor chip are increased by a redistribution process, the size and the distance therebetween may not be enough to be directly mounted on an electronic device main board.

Figure 5:
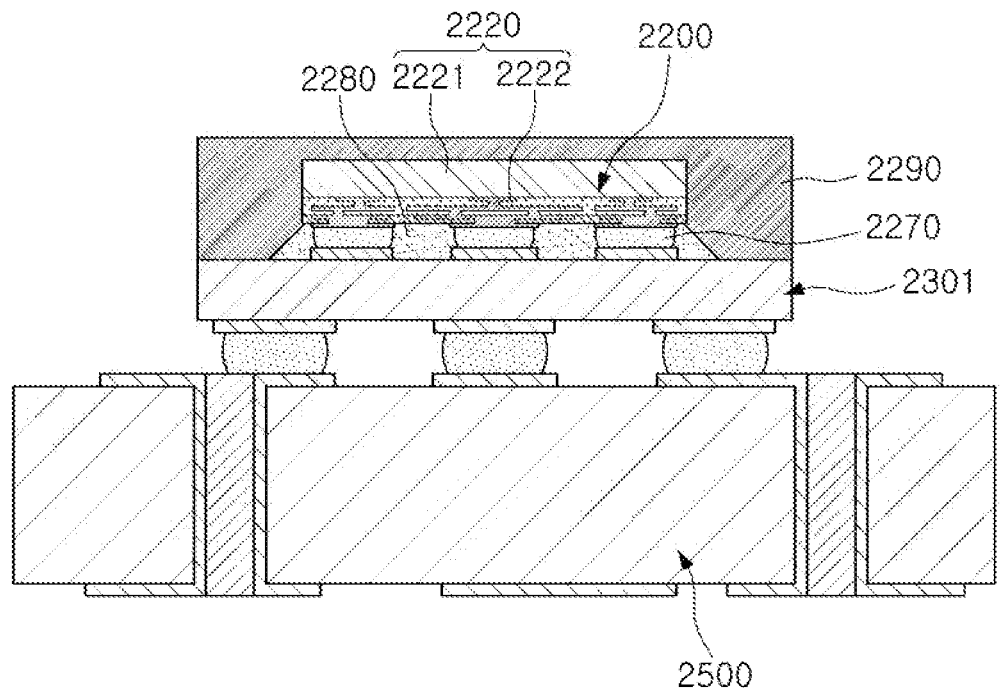
FIG. 5 is a schematic cross-sectional view of a case for a fan-in semiconductor package mounted on a ball grid array (BGA) substrate to ultimately be mounted on a main board of an electronic device.

FIG. 5 is a schematic cross-sectional view of a case for a fan-in semiconductor package mounted on a ball grid array (BGA) substrate to ultimately be mounted on a main board of an electronic device.

Figure 6:
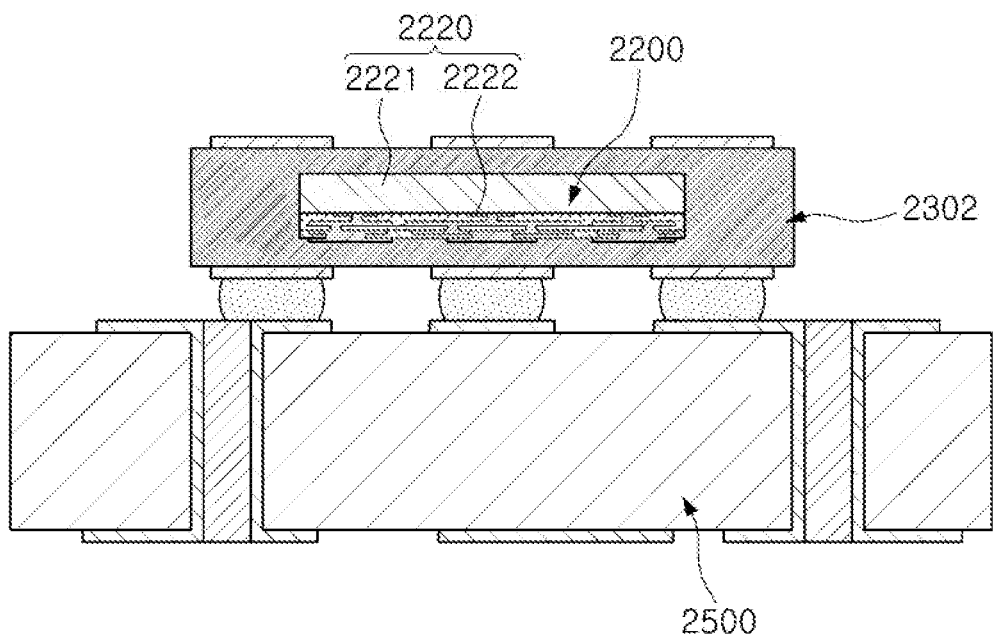
FIG. 6 is a schematic cross-sectional view of a case for a fan-in semiconductor package embedded in a BGA substrate to ultimately be mounted on a main board of an electronic device.

FIG. 6 is a schematic cross-sectional view of a case for a fan-in semiconductor package embedded in a BGA substrate to ultimately be mounted on a main board of an electronic device.

Referring to FIGS. 5 and 6, in the case of a fan-in semiconductor package 2200, connection pads 2222 of a semiconductor chip 2220, for example, I/O terminals, may be redistributed through a BGA substrate 2301, and resultantly, the fan-in semiconductor package 2200 may be mounted on a main board 2500 of an electronic device in a state in which the fan-in semiconductor package 2200 is mounted on the BGA substrate 2301. In this case, a solder ball 2270 and the like may be fixed by an underfill resin 2280 or the like, and an outer portion thereof may be covered with a molding material 2290 or the like. Alternatively, the fan-in semiconductor package 2200 may be embedded in a separate BGA substrate 2302, and in the embedding state of the fan-in semiconductor package 2200, the connection pads 2222 of the semiconductor chip 2220, for example, the I/O terminals, may again be redistributed by the BGA substrate 2302, and may ultimately be mounted on the main board 2500 of the electronic device.

As such, since the fan-in semiconductor package is difficult to directly mount on the main board of the electronic device, the fan-in semiconductor package needs to be mounted on a separate BGA substrate and then remounted on a main board of an electronic device via re-passing through a packaging process, or may be mounted on a main board of an electronic device and used in a state in which the fan-in semiconductor package is embedded in a BGA substrate.

Fan-Out Semiconductor Package

Figure 7:
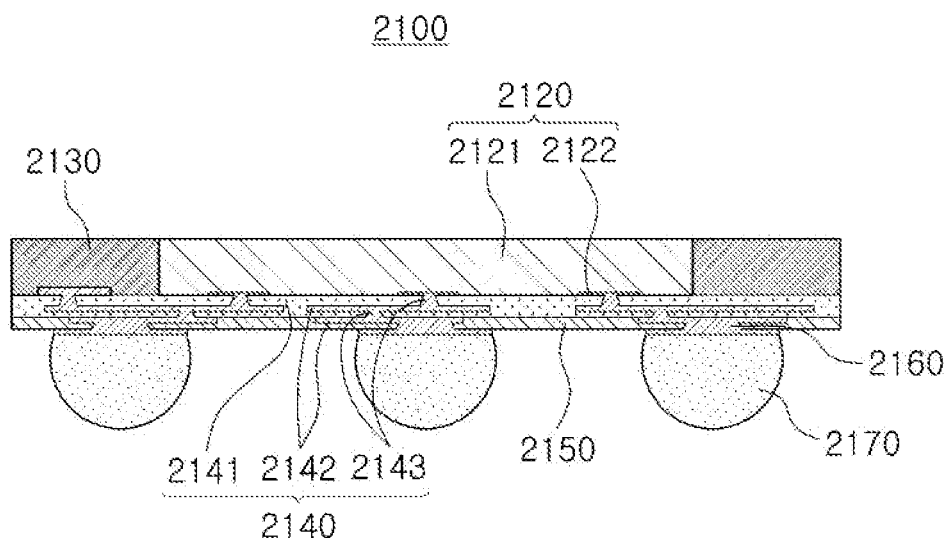
FIG. 7 is a schematic cross-sectional view of a fan-out semiconductor package.

FIG. 7 is a schematic cross-sectional view of a fan-out semiconductor package.

With reference to FIG. 7, in the case of a fan-out semiconductor package 2100, for example, an outer side of a semiconductor chip 2120 may be protected by an encapsulant 2130, and a connection pad 2122 of the semiconductor chip 2120 may be redistributed outwardly of the semiconductor chip 2120 by a connection member 2140. In this case, a passivation layer 2150 may further be formed on the connection member 2140, and further, an under-bump metal layer 2160 may be formed in an opening of the passivation layer 2150. A solder ball 2170 may further be formed on the under-bump metal layer 2160. The semiconductor chip 2120 may be an integrated circuit (IC) including a body 2121, a connection pad 2122, a passivation film (not shown), and the like. The connection member 2140 may include an insulating layer 2141, a redistribution layer 2142 formed on the insulating layer 2141, and a via 2143 electrically connecting the connection pad 2122, the redistribution layer 2142 and the like to each other.

As described above, the fan-out semiconductor package may be formed in a form in which I/O terminals are redistributed to the outside of the semiconductor chip through the connection member formed on the semiconductor chip. As described above, in the fan-in semiconductor package, all of I/O terminals of the semiconductor chip should be disposed inside the semiconductor chip, and thus, if the element size is reduced, ball size and pitch need to be reduced. Thus, a standardized ball layout may not be used. On the other hand, in the fan-out semiconductor package, the I/O terminals may be redistributed to the outside of the semiconductor chip through the connection member formed on the semiconductor chip, and thus, a standardized ball layout may be used as it is, even in the case in which the size of the semiconductor chip is reduced. Thus, the fan-out semiconductor package may be mounted on a main board of an electronic device without using a separate BGA substrate as will be described later.

Figure 8:
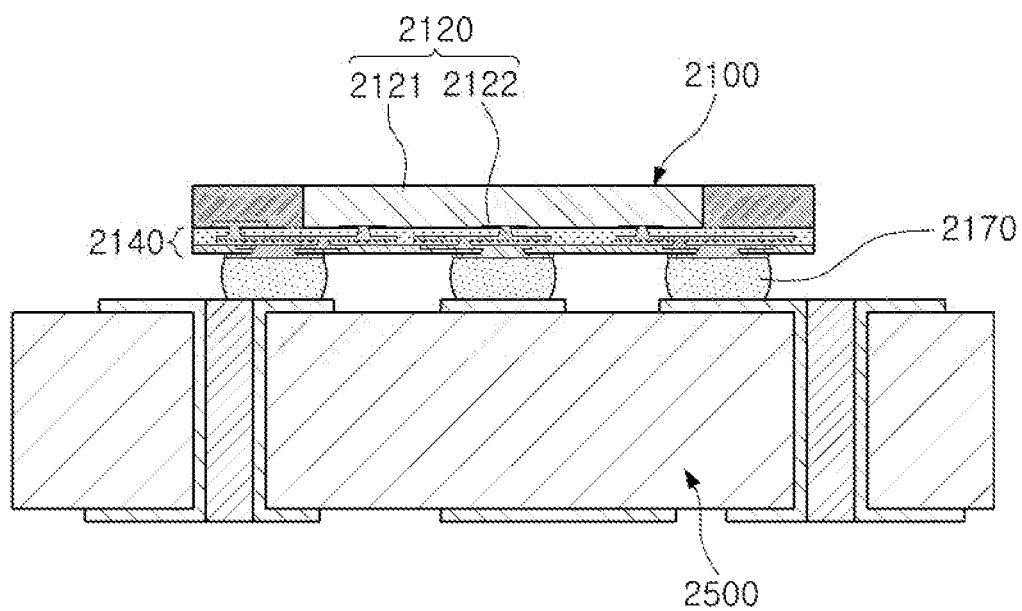
FIG. 8 is a cross-sectional view schematically illustrating a case in which a fan-out semiconductor package is mounted on a main board of an electronic device.

FIG. 8 is a schematic cross-sectional view of a case for a fan-out semiconductor package mounted on a main board of an electronic device.

Referring to FIG. 8, a fan-out semiconductor package 2100 may be mounted on a main board 2500 of an electronic device through solder balls 2170 or the like. For example, as described above, in the case of the fan-out semiconductor package 2100, a connection member 2140 may be disposed on a semiconductor chip 2120, to allow connection pads 2122 to be redistributed to a fan-out region exceeding a size of the semiconductor chip 2120, and thus, a standardized ball layout may be used as it is, and as a result, the fan-out semiconductor package 2100 may be mounted on the main board 2500 of the electronic device without a separate BGA substrate or the like.

As such, since the fan-out semiconductor package may be mounted on the main board of the electronic device without a separate BGA substrate, a thickness of the fan-out semiconductor package may be reduced as compared to that of the fan-in semiconductor package using the BGA substrate. Thus, the miniaturization and slimness of a semiconductor package may be implemented. In addition, the fan-out semiconductor package may have relatively excellent thermal characteristics and electrical characteristics to be suitable for mobile products. In addition, the fan-out semiconductor package may be implemented more compactly than a general package-on-package (POP) type using a printed circuit board (PCB), and may be implemented to prevent the occurrence of warpage and problems caused thereby.

On the other hand, the fan-out semiconductor package refers to a package technology for mounting a semiconductor chip on a main board of an electronic device, or the like, and for protecting a semiconductor chip from external impacts, and is based on a technology different from that of a printed circuit board (PCB), such as an BGA substrate or the like, including a fan-in semiconductor package embedded therein, in terms of the scale, the usage, and the like.

Hereinafter, a fan-out semiconductor package capable of effectively preventing the occurrence of warpage will be described with reference to the drawings.

Figure 9:
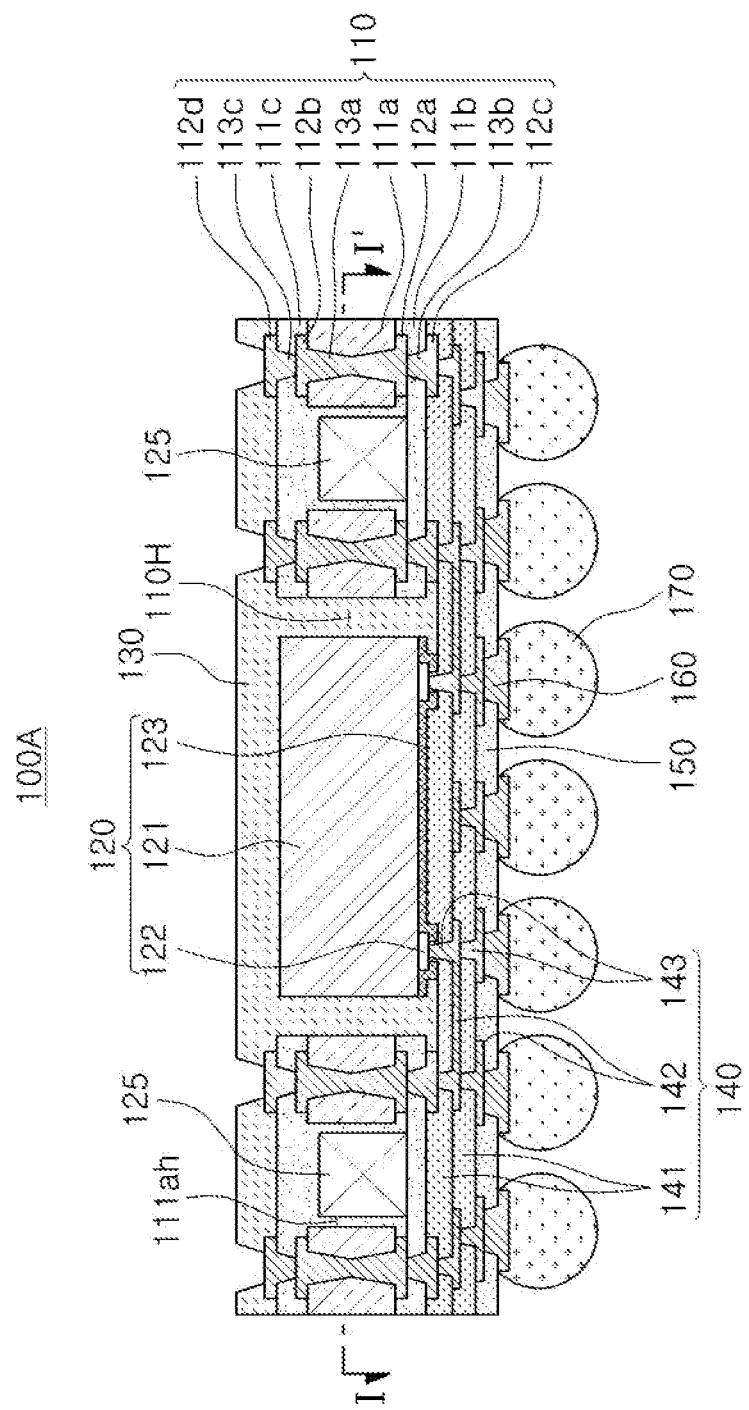
FIG. 9 is a schematic cross-sectional view of an example of a fan-out semiconductor package.

FIG. 9 is a schematic cross-sectional view of an example of a fan-out semiconductor package.

Figure 10:
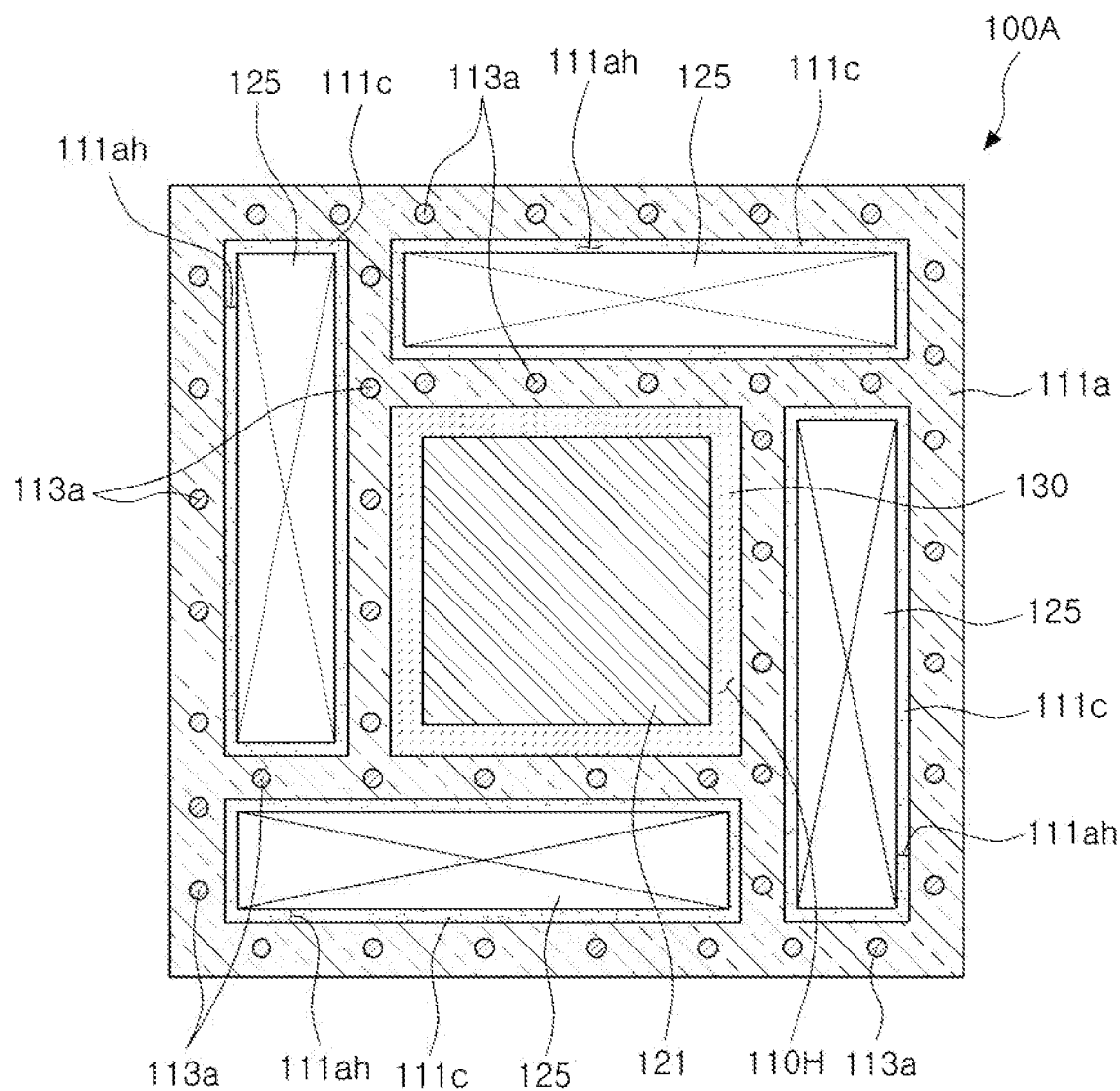
FIG. 10 is a schematic cutaway plan view of the fan-out semiconductor package, taken along line I-I' of FIG. 9.

FIG. 10 is a schematic cutaway plan view of the fan-out semiconductor package, taken along line I-I' of FIG. 9.

Referring to FIGS. 9 and 10, a fan-out semiconductor package 100A according to an exemplary embodiment may include a core member 110 including a through hole 110H, one or more dummy structures 125 disposed in the core member 110, a semiconductor chip 120 disposed in the through hole 110H of the core member 110 and having an active surface on which a connection pad 122 is disposed and an inactive surface disposed to oppose the active surface, an encapsulant 130 filling at least a portion of the through hole 110H while sealing at least a portion of each of the core member 110 and the semiconductor chip 120, a connection member 140 including a redistribution layer 142 disposed on the core member 110 and the active surface of the semiconductor chip 120 and electrically connected to the connection pad 122, a passivation layer 150 disposed on the connection member 140, an under-bump metal layer 160 disposed on an opening of the passivation layer 150, and an electrical connection structure 170 disposed on the passivation layer 150 and connected to the under-bump metal layer 160.

On the other hand, in the case of a semiconductor package, a plurality of packages may be manufactured using a wafer or a panel for mass production, or the like, and individual packages may be obtained by a sawing process or the like. However, if a difference in unit warpage occurs within the panel for manufacturing of a package, due to a difference in physical properties such as thermal expansion coefficients, or the like, of various materials in the package, or due to a hardening shrinkage, or the like, of a layer including a resin component such as an encapsulant, in manufacturing a plurality of packages, it may be difficult to manufacture products of the same quality due to problematic warpage. Further, panel-level warpage as well as package warpage may also be problematic.

Meanwhile, in the fan-out semiconductor package 100A according to an exemplary embodiment, since the core member 110 having the through hole 110H may be disposed in a sealing region of the semiconductor chip 120, warpage of the fan-out semiconductor package 100a may be controlled by the core member 110. In addition, various types of distribution may be performed as compared with the case of designing distribution layers 112a, 112b, 112c and 112d in the core member 110. In addition, one or more dummy structures 125 may be disposed inside the core member 110. In detail, as described above, a relatively high degree of rigidity may be provided, as compared to that in a case in which the dummy structure 125 is not disposed in a fan-out region, based on the semiconductor chip 120. Further, various warpage control efforts may be more effectively performed through control of a thermal expansion coefficient or the like. The dummy structure 125 may include a semiconductor material in a manner similar to that of the semiconductor chip 120. In detail, the dummy structure 125 may be a silicon-based die, for example, a silicon die, including silicon (Si). For example, the dummy structure 125 may be a silicon piece without an integrated circuit. For another example, the dummy structure 125 may be a silicon piece without a functional integrated circuit. For another example, the dummy structure 125 may be a silicon piece without connection pads. For another example, the dummy structure 125 may be a silicon piece covered by an insulating material. In this case, warpage occurring locally in a package region may offset each other, and thus, a difference in thermal expansion coefficients in the package may be significantly reduced, to be relatively effective for control of warpage. On the other hand, the dummy structure 125 may be signal-disconnected from the semiconductor chip 120. In addition, the dummy structure 125 may also be signal-disconnected from the redistribution layer 142 of the connection member 140 or the distribution layers 112a to 112d of the core member 110. In detail, the expression "dummy" used in the present disclosure basically indicates that signals are not exchanged with the semiconductor chip 120 in a circuit.

Hereinafter, respective configurations included in the fan-out semiconductor package 100A in an example will be described in more detail.

The core member 110 may further improve rigidity of the fan-out semiconductor package 100A depending on a detailed material of the core member, and may serve to secure uniformity of thickness of the encapsulant 130, or the like. For example, when the distribution layers 112a, 112b, 112c and 112d and vias 113a, 113b and 113c are formed in the core member 110 as illustrated in FIG. 9, the fan-out semiconductor package 100A may be used as a package-on-package (POP)-type package. The core member 110 may include the through hole 110H. In the through hole 110H, the semiconductor chip 120 may be disposed to be spaced apart from the core member 110 by a predetermined distance. A periphery of a side surface of the semiconductor chip 120 may be surrounded by the core member 110, which is merely provided by way of example. Thus, various modifications thereof may be provided, and other functions may be performed according to a form thereof. One or more dummy structures 125 may be disposed inside the core member 110, and thus, warpage may be controlled relatively effectively.

The core member 110 may include a first insulating layer 111a, a first distribution layer 112a and a second distribution layer 112b disposed on two surfaces of the first insulating layer 111a, a second insulating layer 111b disposed on the first insulating layer 112a and covering the first distribution layer 112a, a third distribution layer 112c disposed on the second insulating layer 111b, a third insulating layer 111c disposed on the first insulating layer 111a to cover the second distribution layer 112b disposed on the first insulating layer 111a, and a fourth distribution layer 112d disposed on the third insulating layer 111c. The first to fourth distribution layers 112a, 112b, 112c and 112d may be electrically connected to a connection pad 122. Since the core member 110 includes a relatively large number of distribution layers 112a, 112b, 112c and 112d, the redistribution layer 142 of the connection member 140 may be further simplified. Thus, a reduction in yield due to defects occurring in a process of forming the connection member 140 may be prevented. The first to fourth distribution layers 112a, 112b, 112c and 112d may be electrically connected to each other, via first to third vias 113a, 113b and 113c penetrating through the first to third insulating layers 111a, 111b and 111c, respectively.

The first insulating layer 111a may have one or more cavities 111ah, and a dummy structure 125 may be disposed in each of the cavities 111ah. The dummy structure 125 may be disposed on the second insulating layer 111b and may be covered with the third insulating layer 111c, which is merely an example. Thus, the arrangement form of the dummy structure 125 may be modified. For example, a cavity may be formed in the second insulating layer 111b or the third insulating layer 111c, and the dummy structure 125 may be disposed thereon, or the dummy structure 125 may be disposed in various combinations.

For example, when the core member 110 and the dummy structure 125 are cut into planes parallel to the inactive surface of the semiconductor chip 120, in detail, when viewed in plan view, as illustrated in FIG. 10, a planar area occupied by the dummy structure 125 may be greater than a planar area of the core member 110, for example, greater than an entire planar area occupied by the first insulating layer 111a, the second insulating layer 111b, and the first via 113a in FIG. 10. As described above, as the planar area occupied by the dummy structure 125 is increased, an effect of disposing the dummy structure 125 may be further increased, and thus, control of warpage may be further effective.

The first insulating layer 111a may have a thickness greater than that of the second insulating layer 111b and that of a portion of the third insulating layer 111c disposed on the first insulating layer 111a. The first insulating layer 111a may have a relatively great thickness to maintain basic rigidity, and the second insulating layer 111b and the third insulating layer 111c may be formed to have a relatively large number of distribution layers 112c and 112d. The first insulating layer 111a may include an insulating material different from those of the second insulating layer 111b and the third insulating layer 111c. For example, the first insulating layer 111a may be, for example, a prepreg including a core material, a filler, and an insulating resin, and the second insulating layer 111b and the third insulating layer 111c may be an ABF film or a photoimageable dielectric (PID) film including a filler and an insulating resin, but are not limited thereto. Similarly, the first via 113a penetrating through the first insulating layer 111a may have a diameter greater than that of each of the second and third vias 113b and 113c penetrating the second and third insulating layers 111b and 111c.

A lower surface of the third distribution layer 112c of the core member 110 may be disposed to be lower than a lower surface of the connection pad 122 of the semiconductor chip 120. Further, a distance between the redistribution layer 142 of the connection member 140 and the third distribution layer 112c of the core member 110 may be less than a distance between the redistribution layer 142 of the connection member 140 and the connection pad 122 of the semiconductor chip 120. The third distribution layer 112c may be disposed on the second insulating layer 111b to have a protruding form, and as a result, may come into contact with the connection member 140. The first distribution layer 112a and the second distribution layer 112b of the core member 110 may be positioned on a level between the active surface and the inactive surface of the semiconductor chip 120. The core member 110 may be formed to correspond to a thickness of the semiconductor chip 120, and the first distribution layer 112a and the second distribution layer 112b formed in the core member 110 may be disposed on a level between the active surface and the inactive surface of the semiconductor chip 120.

A thickness of each of the distribution layers 112a, 112b, 112c and 112d of the core member 110 may be greater than a thickness of the redistribution layer 142 of the connection member 140. Since the core member 110 is usually manufactured through a substrate process, the distribution layers 112a, 112b, 112c and 112d may also be formed to have a relatively large size. On the other hand, since the connection member 140 is usually manufactured through a semiconductor process, the redistribution layer 142 may be formed to have a relatively small size to be thinned.

As a material of the insulating layer 111, an insulating material may be used. As the insulating material, a thermosetting resin such as an epoxy resin, a thermoplastic resin such as polyimide, or a resin mixture provided by mixing such resins with an inorganic filler or a resin formed by impregnating such resins in a core material such as a glass fiber, a glass cloth, a glass fabric, or the like, together with an inorganic filler, for example, a prepreg resin, Ajinomoto Build-up Film (ABF) resin, FR-4 resin, Bismaleimide Triazine (BT) resin, or the like, may be used. For example, when a high rigidity material such as a prepreg resin including a glass fiber or the like is used, the core member 110 may be used as a support member for rigidity of the fan-out semiconductor package 100A.

The distribution layers 112a, 112b, 112c and 112d may serve to redistribute the connection pads 122 of the semiconductor chip 120. As a material of formation of the distribution layers 112a, 112b, 112c and 112d, a conductive material such as copper (Cu), aluminum (Al), silver (Ag), tin (Sn), gold (Au), nickel (Ni), lead (Pb), titanium (Ti), or alloys thereof or the like, may be used. The distribution layers 112a, 112b, 112c and 112d may perform various functions according to a design of a relevant layer. For example, the distribution layers 112a, 112b, 112c and 112d may include a ground (GrouND: GND) pattern, a power (PoWeR: PWR) pattern, a signal (Signal: S) pattern, and the like. In this case, the signal S pattern may include various signals, except for a ground (GND) pattern, a power (PWR) pattern, and the like, for example, a data signal or the like. Further, a via pad, a wire pad, an electrical connection structure pad, and the like may be included therein.

The vias 113a, 113b and 113c may electrically connect the distribution layers 112a, 112b, 112c and 112d formed as different layers, to each other, thereby forming an electrical path in the core member 110. As a material of formation of the vias 113a, 113b and 113c, a conductive material may also be used. The vias 113a and 113b may be fully filled with a conductive material, or may be formed by allowing a conductive material to be formed along a wall surface of a via hole. Further, the vias 113a, 113b and 113c may have any shapes known in the art, such as a cylindrical shape, an hourglass shape or the like, as well as a tapered shape.

The semiconductor chip 120 may be an integrated circuit (IC) in which hundreds to millions or more devices are integrated into one chip. The integrated circuit may be a processor chip, such as a central processor, for example, a CPU, a graphics processor, for example, a GPU, a field programmable gate array (FPGA), a digital signal processor, a cryptographic processor, a microprocessor, a microcontroller, and the like, in detail, may be an application processor (AP), but is not limited thereto. For example, the integrated circuit may be a logic chip such as an analog-to-digital converter, an application-specific IC (ASIC), and the like, or may be a memory chip such as a volatile memory, for example, a DRAM, a nonvolatile memory, for example, a ROM, a flash memory, and the like. Further, the circuits may also be disposed to be combined with each other.

The semiconductor chip 120 may be formed, based on an active wafer. In this case, a semiconductor material, such as silicon (Si), germanium (Ge), gallium arsenide (GaAs), or the like, may be used as a base material of a body 121. Various circuits may be formed in the body 121. The connection pad 122 may be provided to electrically connect the semiconductor chip 120 to other components. As a material thereof, a conductive material such as aluminum (Al) or the like may be used without any particular limitation. A passivation film 123 exposing the connection pad 122 may be formed on the body 121. The passivation film 123 may be an oxide film or a nitride film, or may be a double layer of an oxide film and a nitride film. A lower surface of the connection pad 122 may have a step with respect to a lower surface of an encapsulant 130 through the passivation film 123, and thus, the encapsulant 130 may fill at least a portion of a space between the passivation film 123 and the connection member 140. In this case, the encapsulant 130 may be prevented from bleeding to the lower surface of the connection pad 122, to some extent. An insulating film (not shown) or the like may also be further disposed on other required positions. The semiconductor chip 120 may be a bare die, and the connection pad 122 may be in directly physical contact with a via 143 of the connection member 140.

The dummy structures 125 may respectively be formed, based on an active wafer. A semiconductor material, such as silicon (Si), germanium (Ge), gallium arsenide (GaAs) or the like, may be used as a base material. For example, the dummy structures 125 may respectively be a silicon base dummy structure, and in this case, when a base material of the body 121 of the semiconductor chip 121 of the semiconductor chip 120 is silicon (Si), a balance thereof may be matched. For another example, the dummy structures 125 may be made of the same material constituting the body 121 of the semiconductor chip 120. For another example, the dummy structures 125 may be made of substantially the same material constituting the body 121 of the semiconductor chip 120 and may be covered by an insulating material. The dummy structure 125 may be electrically insulated from the semiconductor chip 120. For example, the dummy structure 125 may also be electrically insulated from the redistribution layer 142 of the connection member 140.

The encapsulant 130 may protect the core member 110, the semiconductor chip 120, and the like. A sealing form thereof is not particularly limited, and any form covering at least a portion of the core member 110, the semiconductor chip 120, and the like may be used. For example, the encapsulant 130 may cover the core member 110 and the inactive surface of the semiconductor chip 120, and may fill a space between the wall surface of the through hole 110H and a side surface of the semiconductor chip 120. The encapsulant 130 may also fill at least a portion of the space between the passivation film 123 of the semiconductor chip 120 and the connection member 140. By filling the through hole 110H with the encapsulant 130, buckling may be reduced while performing an adhesive function depending on a detailed material.

A material of the encapsulant 130 is not particularly limited. For example, an insulating material may be used. As the insulating material, a thermosetting resin such as an epoxy resin, a thermoplastic resin such as polyimide, or a resin mixture provided by mixing such resins with an inorganic filler or a resin formed by impregnating such resins in a core material such as a glass fiber, a glass cloth, a glass fabric, or the like, together with an inorganic filler, for example, a prepreg resin, Ajinomoto Build-up Film (ABF) resin, FR-4 resin, Bismaleimide Triazine (BT) resin, or the like, may be used. A photoimageable encapsulant (PIE) resin may be used as required.

The connection member 140 may redistribute the connection pads 122 of the semiconductor chip 120. The connection pads 122 of dozens to hundreds of semiconductor chips 120 having various functions may be redistributed through the connection member 140, and may be physically and/or electrically connected to external devices via the electrical connection structure 170, depending on functions thereof. The connection member 140 may include an insulating layer 141 disposed on the core member 110 and the active surface of the semiconductor chip 120, the redistribution layer 142 disposed on the insulating layer 141, and the via 143 connecting the connection pad 122 and the redistribution layer 142 to each other while penetrating through the insulating layer 141. Although the connection member 140 is illustrated as respectively being comprised of one insulating layer, a redistribution layer, and a via layer in the drawings, the connection member 140 may also be comprised of a relatively large number of insulating layers, redistribution layers, and via layers.

As a material of the insulating layer 141, an insulating material may be used. In this case, in addition to the above-described insulating material, a photoimageable dielectric material such as a PID resin may be used. For example, the insulating layer 141 may be a photoimageable dielectric layer. For example, when the insulating layer 141 has photoimageable properties, the insulating layer 141 may be formed to have a reduced thickness, and a fine pitch of the via 143 may be obtained relatively easily. The insulating layer 141 may be a photoimageable dielectric layer including an insulating resin and an inorganic filler. For example, when the insulating layer 141 is comprised of multiple layers, materials of multiple layers may be the same as each other, and as necessary, may be different from each other. When the insulating layer 141 is comprised of multiple layers, boundaries thereof may be unclear.

The redistribution layer 142 may serve to redistribute the connection pads 122, and as a material of the redistribution layer 142, a conductive material such as copper (Cu), aluminum (Al), silver (Ag), tin (Sn), gold (Au), nickel (Ni), lead (Pb), titanium (Ti), or alloys thereof or the like, may be used. The redistribution layer 142 may perform various functions according to a design of a relevant layer. For example, the redistribution layer 142 may include a ground (GrouND: GND) pattern, a power (PoWeR: PWR) pattern, a signal (Signal: S) pattern, and the like. In this case, the signal S pattern may include various signals, for example, data signals, except for a ground (GND) pattern, a power (PWR) pattern, and the like. In addition, a via pad pattern, an electrical connection structure pad pattern, and the like may be included therein.

The via 143 may electrically connect the redistribution layer 142, the connection pads 122, and the like, formed in different layers, to each other, thereby forming an electrical path in the fan-out semiconductor package 100A. As a material of the via 143, a conductive material such as copper (Cu), aluminum (Al), silver (Ag), tin (Sn), gold (Au), nickel (Ni), lead (Pb), titanium (Ti), or alloys thereof may be used. The via 143 may be fully filled with a conductive material, or may be formed by allowing a conductive material to be formed along a wall of a via hole. In addition, any shape known in the art, such as a tapered shape, may be employed.

The passivation layer 150 may protect the connection member 140 from external physical chemical damage or the like. The passivation layer 150 may have an opening exposing at least a portion of the redistribution layer 142 of the connection member 140. The opening may be formed as several tens to several thousands of openings in the passivation layer 150. A material of the passivation layer 150 is not particularly limited. For example, an insulating material may be used. As the insulating material, a thermosetting resin such as an epoxy resin, a thermoplastic resin such as polyimide, or a resin mixture provided by mixing such resins with an inorganic filler or a resin formed by impregnating such resins in a core material such as a glass fiber, a glass cloth, a glass fabric, or the like, together with an inorganic filler, for example, a prepreg resin, Ajinomoto Bulid-up Film (ABF) resin, FR-4 resin, Bismaleimide Triazine (BT) resin, or the like, may be used. Alternatively, a solder resist may also be used.

The under-bump metal layer 160 may improve connection reliability of the electrical connection structure 170, and thus, may improve board level reliability of the fan-out semiconductor package 100A. The under-bump metal layer 160 may be connected to the redistribution layer 142 of the connection member 140, exposed through the opening of the passivation layer 150. The under-bump metal layer 160 may be formed in the opening of the passivation layer 150 using a conductive material, for example, a metal, known in the art, via a metallization method known in the art, but is not limited thereto.

The electrical connection structure 170 may physically and/or electrically connect the fan-out semiconductor package 100A to external devices. For example, the fan-out semiconductor package 100A may be mounted on a main board of an electronic device via the electrical connection structure 170. The electrical connection structure 170 may be formed of a conductive material, for example, a solder or the like, which is merely provided by way of example. The material thereof is not particularly limited. The electrical connection structure 170 may be a land, a ball, a pin, or the like. The electrical connection structure 170 may be formed of multiple layers or a single layer. For example, when the electrical connection structure 170 is formed of multiple layers, the electrical connection structure 170 may include a copper pillar and a solder. When the electrical connection structure 170 is formed of a single layer, the electrical connection structure 170 may include a tin-silver solder or copper, which is merely provided by way of example, without particular limitation.

The number, spacing, arrangement type, and the like of the electrical connection structure 170 are not particularly limited, and may be sufficiently modified according to design specifications. For example, the number of electrical connection structures 170 may be in a range of tens to thousands, depending on the number of connection pads 122, and may be more or less thereof. For example, when the electrical connection structure 170 is a solder ball, the electrical connection structure 170 may cover a side surface of the under-bump metal layer 160, formed to extend on one surface of the passivation layer 150.

In the electrical connection structure 170, at least one electrical connection structure 170 may be disposed in a fan-out region. The fan-out region refers to a region outside a region in which the semiconductor chip 120 is disposed. A fan-out package may have excellent reliability as compared to that of a fan-in package, may implement a plurality of I/O terminals, and may facilitate 3D interconnection. In addition, the fan-out package may be manufactured to have a reduced thickness, as compared to a ball grid array (BGA) package, a land grid array (LGA) package, or the like, and thus, may have excellent price competitiveness.

Though not illustrated in the drawings, a metal thin film may be formed on a wall surface of the through hole 110H, to radiate heat and/or shield electromagnetic waves, as required. In addition, a plurality of semiconductor chips 120 performing the same or different functions may be disposed in the through hole 110H, as required. Further, a separate passive component, such as an inductor, a capacitor or the like, may be disposed in the through hole 110H, as required. In addition, a surface mounting (SMT) component including a passive component, such as an inductor, a capacitor or the like, may also be disposed on a surface of the passivation layer 150, as required.

FIGS. 11A to 11D are schematic views of processes of a method of manufacturing the fan-out semiconductor package of FIG. 9.

Figure 11A:
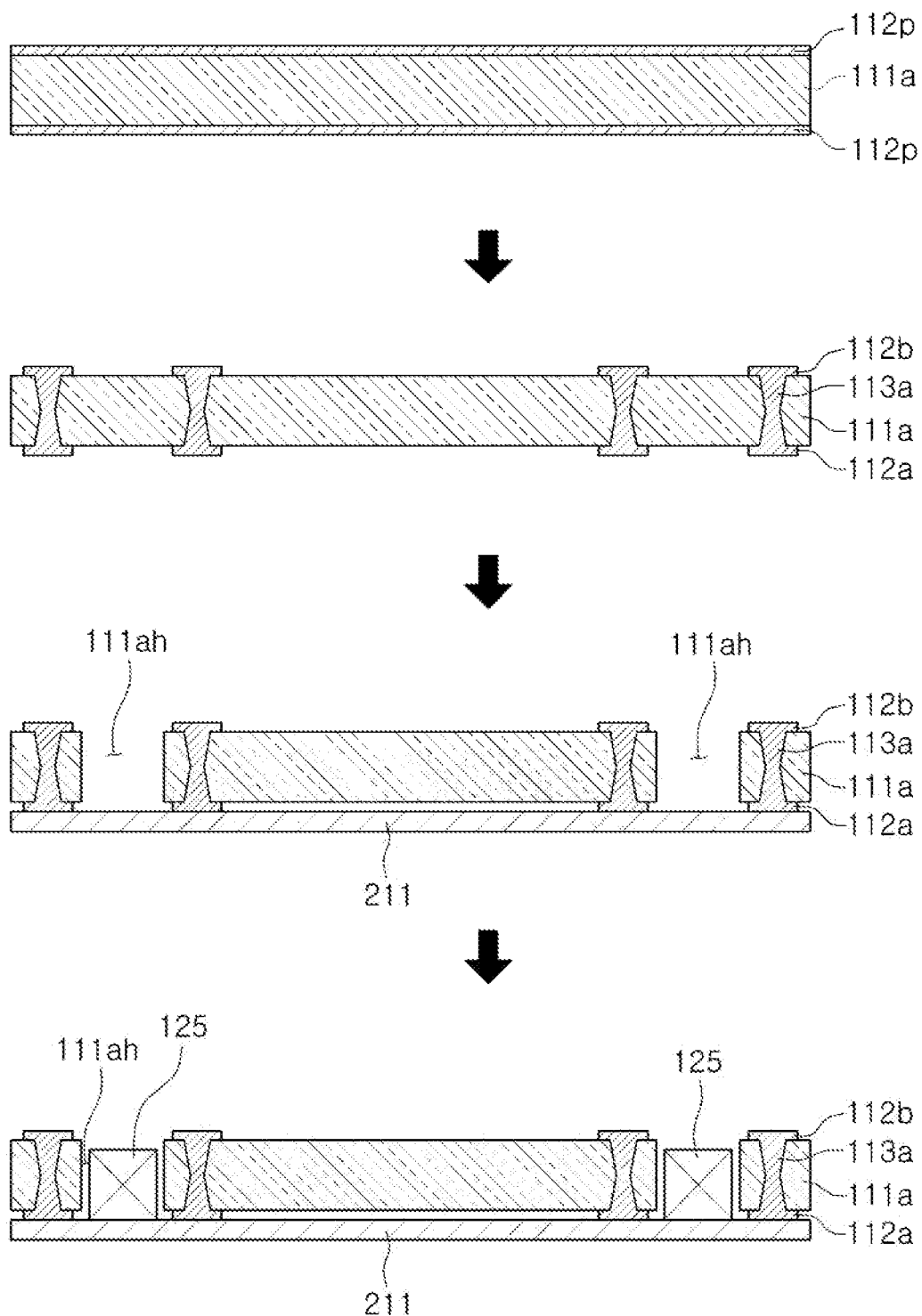
FIGS. 11A to 11D are schematic views of processes of a method of manufacturing the fan-out semiconductor package of FIG. 9.

Referring to FIG. 11A, a first insulating layer 111a may first be prepared. The first insulating layer 111a may be prepared using a copper clad laminate (CCL) provided with copper foils 112p formed on two surfaces thereof. Next, a hole may be formed in the first insulating layer 111a, using laser drilling and/or mechanical drilling and/or sand blasting, or the like, and then the copper foil 112p may be used as a seed layer to be electrolyzed and/or electroless plated, such that first and second distribution layers 112a and 112b and a first via 113a may be formed. Subsequently, a cavity 111ah may be formed in the first insulating layer 111a. The cavity 111ah may also be formed using laser drilling and/or mechanical drilling and/or sand blasting, or the like. Next, an adhesive film 211 may be attached to a lower side of the first insulating layer 111a. The adhesive film 211 may be a tape or the like, including an epoxy resin. Then, one or more dummy structures 125 may be attached onto the adhesive film 211 of the cavity 111ah.

Figure 11B:
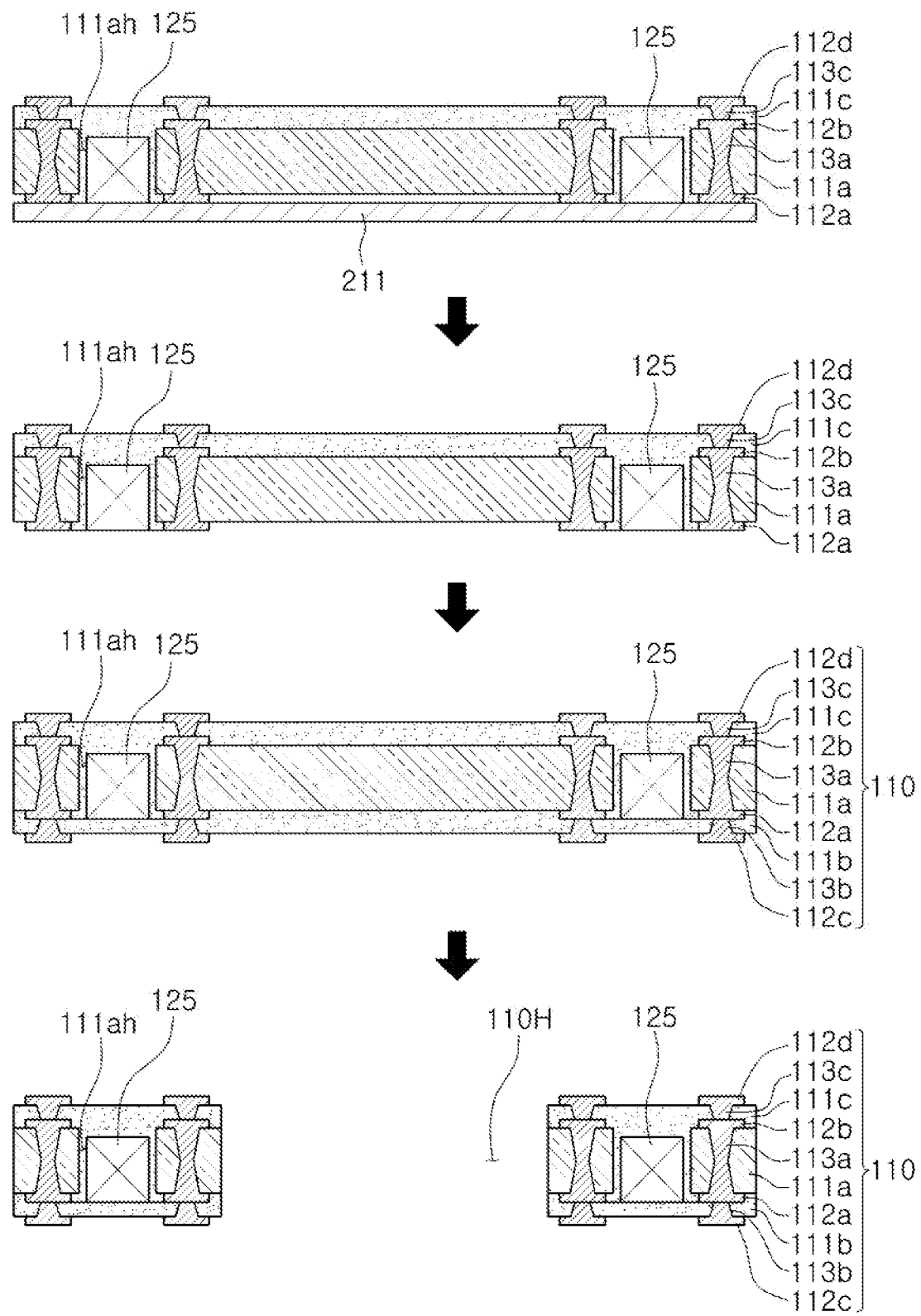

With reference to FIG. 11B, a third insulating layer 111c may be formed on the adhesive film 211 by a laminating method, a coating method, or the like, to cover the dummy structure 125 and the like. Further, a via hole may be formed in the third insulating layer 111c using laser drilling and/or mechanical drilling and/or sand blasting, or the like, and then a fourth distribution layer 112d and a third via 113c may be formed by an electrolytic and/or an electroless plating process. Next, the adhesive film 211 may be removed. Subsequently, a second insulating layer 111b may be formed on a lower side of the first insulating layer 111a from which the adhesive film 211 has been removed, by a laminating method, a coating method, or the like. Then, a via hole may be formed in the second insulating layer 111b, using laser drilling and/or mechanical drilling and/or sand blasting, or the like, and then, a third distribution layer 112c and a second via 113b may be formed in an electrolytic and/or electroless plating process. The core member 110 may be prepared through a series of processes. Next, a through hole 110H may be formed in the core member 110 using laser drilling and/or mechanical drilling and/or sand blasting, or the like.

Figure 11C:
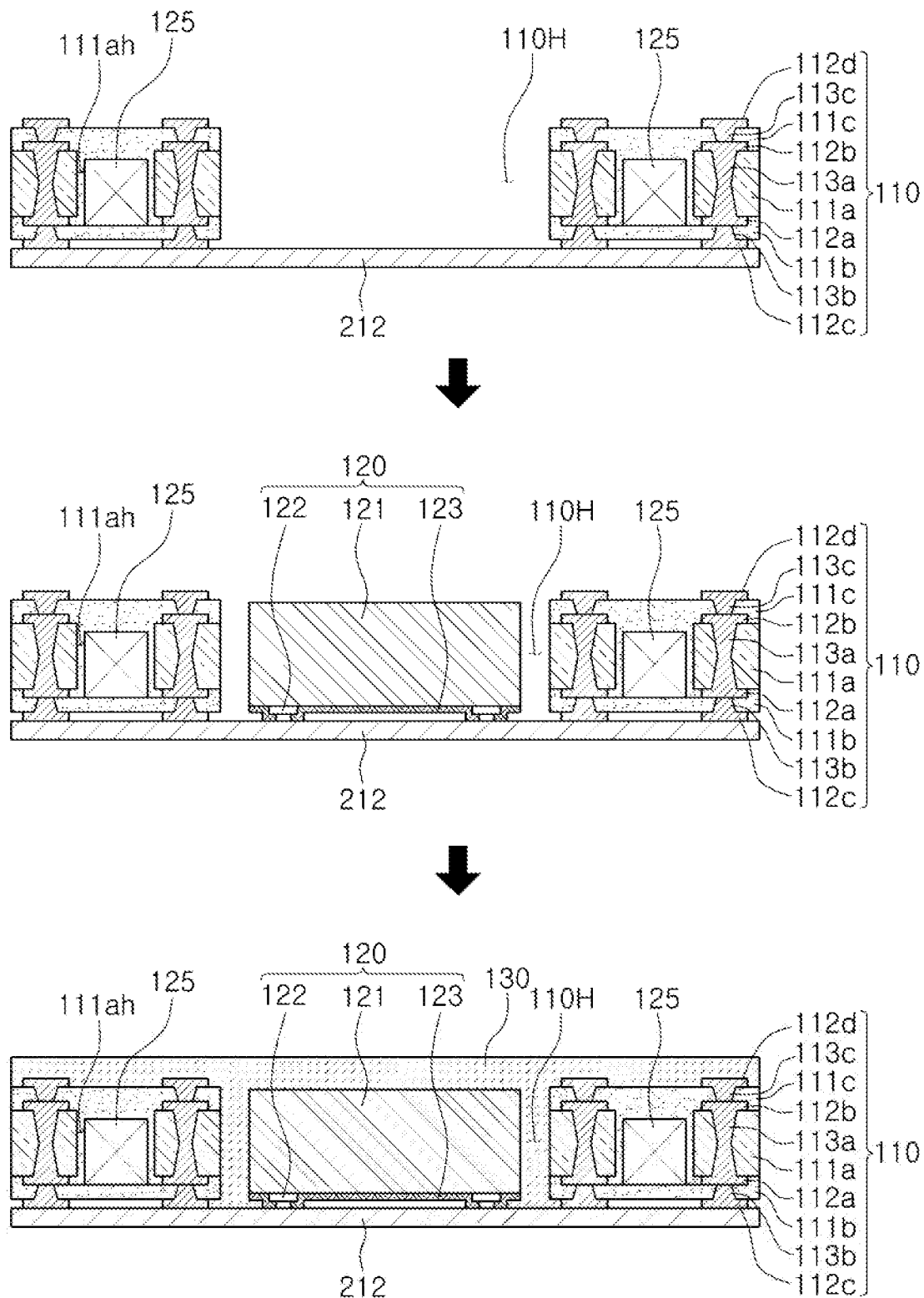

Referring to FIG. 11C, subsequently, an adhesive film 212 may be attached to a lower side of the core member 110. The adhesive film 212 may be tape or the like, including an epoxy resin. Next, a semiconductor chip 120 may be attached to the adhesive film 212 of the through hole 110H in a face-down manner. Next, an encapsulant 130 may be formed on the adhesive film 212 by a laminating method, a coating method, or the like, to seal the semiconductor chip 120 and the like.

Figure 11D:
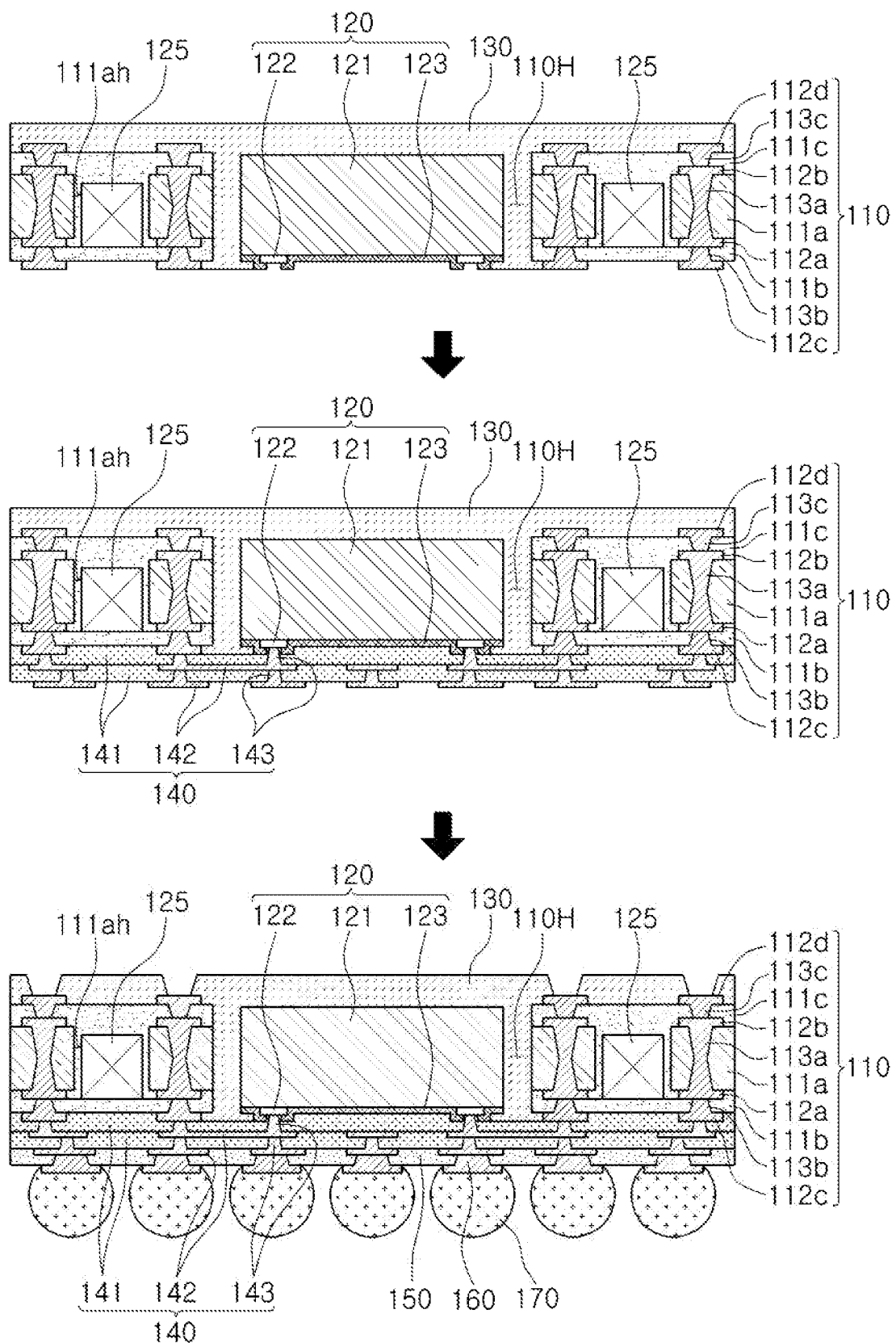

Referring to FIG. 11D, next, the adhesive film 212 may be removed. Then, a connection member 140 may be formed on a lower side of the core member 110 from which the adhesive film 212 has been removed. The connection member 140 may be formed by forming an insulating layer 141 using a PID laminating method or a coating method, forming a via hole in the insulating layer 141 using a photolithography method, and forming a redistribution layer 142 and a via 143 using electrolytic plating or electroless plating. Then, a passivation layer 150, an under-bump metal layer 160, an electrical connection structure 170, and the like may be formed on the connection member 140, in a manner known in the art, as required. Further, an opening may be formed in an upper portion of the encapsulant 130. On the other hand, a series of processes may be performed at a panel level, and in this case, when a dicing process is modified, a plurality of the fan-out semiconductor packages 100A may be manufactured in a single process.

Figure 12:
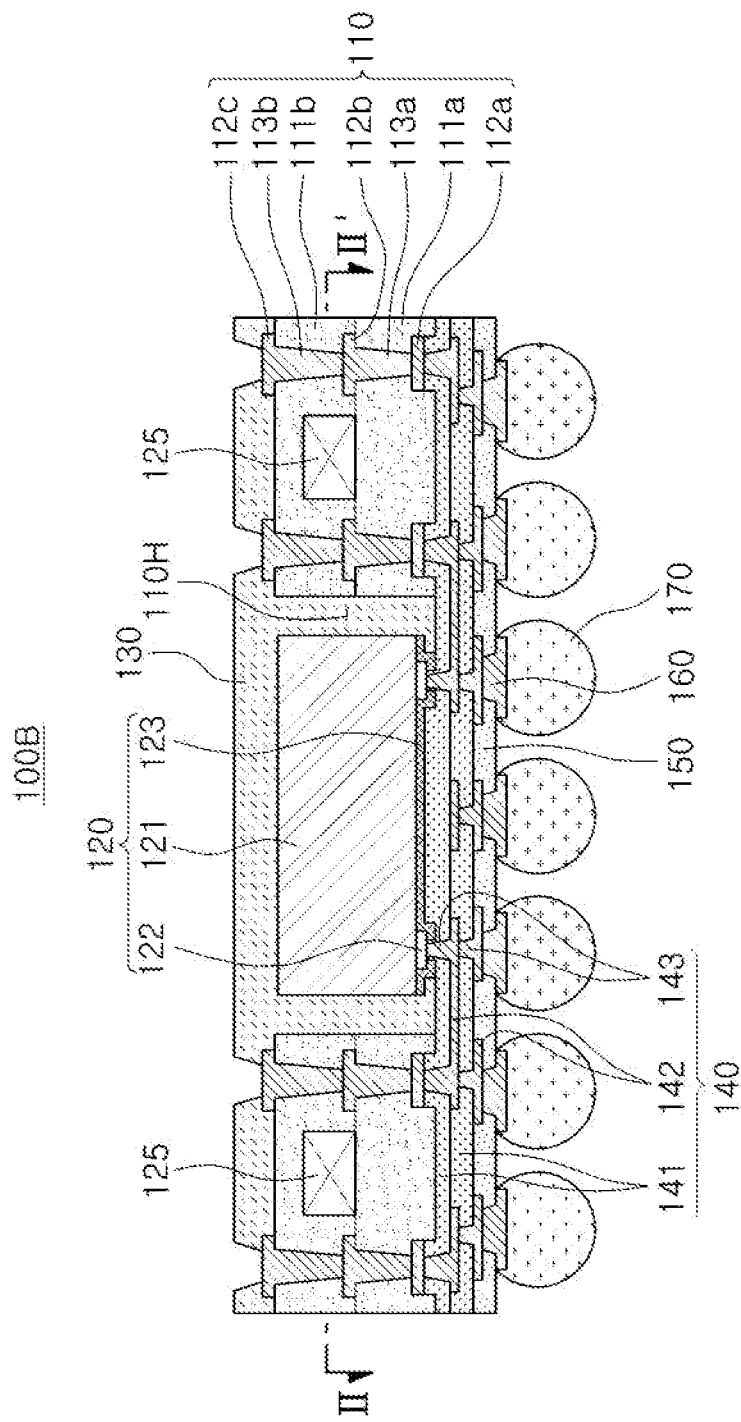
FIG. 12 is a schematic cross-sectional view of another example of a fan-out semiconductor package.

FIG. 12 is a schematic cross-sectional view of another example of a fan-out semiconductor package.

Figure 13:
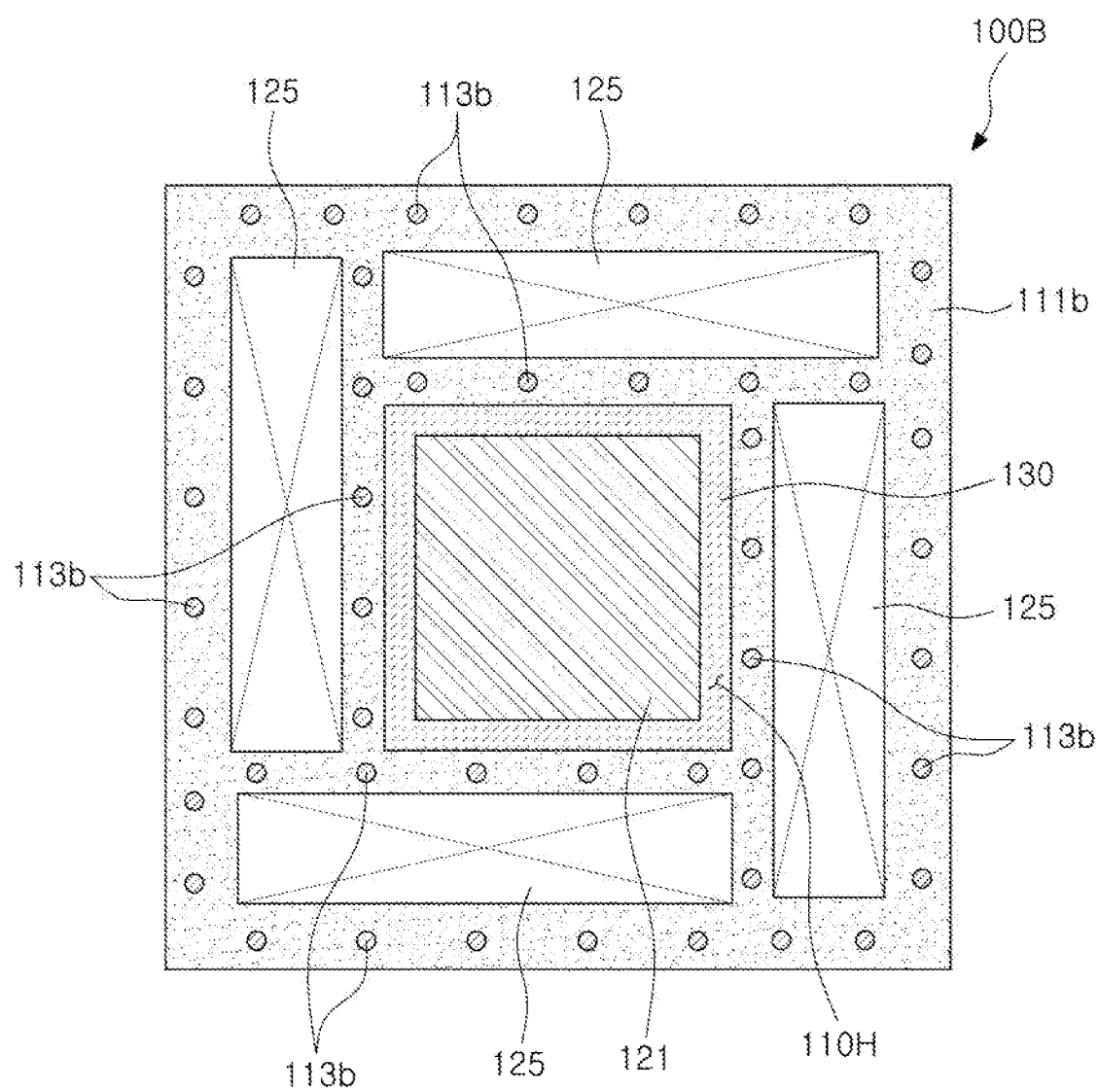
FIG. 13 is a schematic cutaway plan view of the fan-out semiconductor package, taken along line II-II' of FIG. 12.

FIG. 13 is a schematic cutaway plan view of the fan-out semiconductor package, taken along line II-II' of FIG. 12.

Referring to FIGS. 12 and 13, in a fan-out semiconductor package 100B according to another example, a core member 110 may include a first insulating layer 111a, a first distribution layer 112a embedded in the first insulating layer 111a in such a manner that a lower surface of the first distribution layer 112a is exposed, a second distribution layer 112b disposed on a side of the first insulating layer 111a, opposing a side of the first insulating layer 111a in which the first distribution layer 112a is embedded, a second insulating layer 111b disposed on the first insulating layer 111a and covering the second distribution layer 112b, and a third distribution layer 112c disposed on the second insulating layer 111b. The first to third distribution layers 112a, 112b and 112c may be electrically connected to a connection pad 122. The first and second distribution layers 112a and 112b, and the second and third distribution layers 112b and 112c, may be electrically connected to each other, through first and second vias 113a and 113b penetrating through the first and second insulating layers 111a and 111b, respectively.

A dummy structure 125 may be disposed on the first insulating layer 111a and may be covered with the second insulating layer 111b, which is merely an example. Thus, an arrangement form of the dummy structure 125 may be changed. For example, the dummy structure 125 may be embedded in the first insulating layer 111a, in such a manner that one surface thereof is exposed, and the dummy structure 125 may also be disposed in various combinations.

For example, when the first distribution layer 112a is embedded in the first insulating layer 111a, a step generated due to a thickness of the first distribution layer 112a may be significantly reduced, and thus, an insulating distance of a connection member 140 may be constant. For example, a difference between a distance from a redistribution layer 142 of the connection member 140 to a lower surface of the first insulating layer 111a, and a distance from the redistribution layer 142 of the connection member 140 to the connection pad 122 of a semiconductor chip 120, may be less than a thickness of the first distribution layer 112a. Thus, a high-density distribution design of the connection member 140 may be facilitated.

A lower surface of the first distribution layer 112a of the core member 110 may be located to be higher than a lower surface of the connection pad 122 of the semiconductor chip 120. A distance between the redistribution layer 142 of the connection member 140 and the first distribution layer 112a of the core member 110 may be greater than a distance between the redistribution layer 142 of the connection member 140 and the connection pad 122 of the semiconductor chip 120. For example, the lower surface of the first distribution layer 112a may have a step with respect to the lower surface of the first insulating layer 111a. As described above, for example, when the first distribution layer 112a is recessed into the first insulating layer 111a to form a step between the lower surface of the first insulating layer 111a and the lower surface of the first distribution layer 112a, the first distribution layer 112a may be prevented from being contaminated due to bleeding of a material of formation of an encapsulant 130.

The second distribution layer 112b of the core member 110 may be positioned on a level between an active surface and an inactive surface of the semiconductor chip 120. The core member 110 may be formed to have a thickness corresponding to a thickness of the semiconductor chip 120, and thus, the second distribution layer 112b formed in the core member 110 may be disposed on a level between the active surface and the inactive surface of the semiconductor chip 120. A thickness of each of the distribution layers 112a, 112b and 112c of the core member 110 may be greater than a thickness of the redistribution layer 142 of the connection member 140. The core member 110 may be manufactured using a general substrate process, and the connection member 140 may be manufactured using a general semiconductor process.

A material of the insulating layers 111a and 111b is not particularly limited. For example, an insulating material may be used. As the insulating material, a thermosetting resin such as an epoxy resin, a thermoplastic resin such as polyimide, or a resin mixture provided by mixing such resins with an inorganic filler or a resin formed by impregnating such resins in a core material such as a glass fiber, a glass cloth, a glass fabric, or the like, together with an inorganic filler, for example, a prepreg resin, Ajinomoto Bulid-up Film (ABF) resin, FR-4 resin, Bismaleimide Triazine (BT) resin, or the like, may be used. A photoimageable dielectric (PID) resin may be used as required.

The first to third distribution layers 112a, 112b and 112c may serve to redistribute the connection pads 122 of the semiconductor chip 120. As a material of formation of the first to third distribution layers 112a, 112b and 112c, a conductive material such as copper (Cu), aluminum (Al), silver (Ag), tin (Sn), gold (Au), nickel (Ni), lead (Pb), titanium (Ti), or alloys thereof or the like, may be used. The first to third distribution layers 112a, 112b and 112c may perform various functions depending on a design of a relevant layer. For example, the first to third distribution layers 112a, 112b and 112c may include a ground (GrouND: GND) pattern, a power (PoWeR: PWR) pattern, a signal (Signal: S) pattern, and the like. In this case, the signal S pattern may include various signals except for a ground (GND) pattern, a power (PWR) pattern, and the like, for example, may include data signals and the like. Further, a via pad, a wire pad, an electrical connection structure pad, and the like may be included therein.

The first and second vias 113a and 113b may electrically connect the first to third distribution layers 112a, 112b and 112c formed in different layers, thereby forming an electrical path in the core member 110. As a material of formation of the first and second vias 113a and 113b, a conductive material may be used. The first and second vias 113a and 113b may be completely filled with a conductive material, or may be formed by allowing a conductive material to be formed along a wall surface of a via hole. Further, as a shape of the first and second vias 113a and 113b, any shape known in the art, such as a cylindrical shape or the like, may be used as well as a tapered shape. For example, when a hole for formation of the first via 113a is formed, a portion of pads of the first distribution layer 112a may serve as a stopper. The first via 113a may have a tapered shape in which a width of an upper portion thereof is greater than a width of a lower portion thereof in terms of positive process characteristics. In this case, the first via 113a may be integrated with a pad pattern of the second distribution layer 112b. In addition, when a hole for the second via 113b is formed, a portion of pads of the second distribution layer 112b may serve as a stopper. The second via 113b may have a tapered shape in which a width of an upper portion thereof is greater than a width of a lower portion thereof in terms of positive process characteristics. In this case, the second via 113b may be integrated with a pad pattern of the third distribution layer 112c.

Other configurations are substantially the same as those described above with respect to the fan-out semiconductor package 100A and the like, and thus, a detailed description will be omitted.

FIGS. 14A to 14D are schematic views of processes of a method of manufacturing the fan-out semiconductor package of FIG. 12.

Figure 14A:
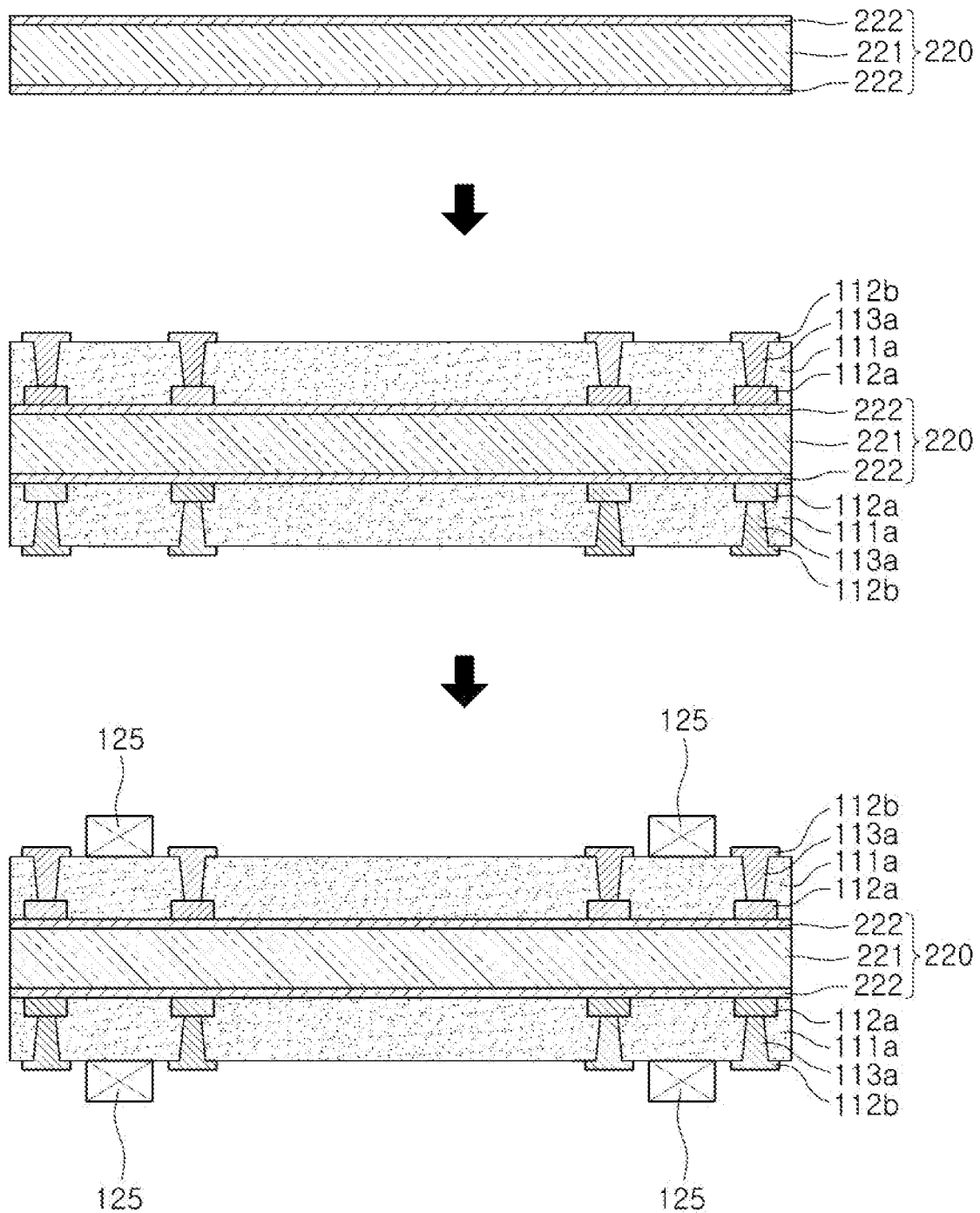
FIGS. 14A to 14D are schematic views of processes of a method of manufacturing the fan-out semiconductor package of FIG. 12.

Referring to FIG. 14A, first, a carrier substrate 220 formed by disposing copper foils 222 on two surfaces of a support layer 221 may be prepared. Each copper foil 222 may be comprised of a plurality of layers. Next, a first distribution layer 112a may be formed by using the copper foil 222 of the carrier substrate 220 as a seed layer via electrolytic or electroless plating. Then, a first insulating layer 111a may be formed using a laminating method or a coating method, a hole may be formed in the first insulating layer 111a using laser drilling and/or mechanical drilling and/or sand blasting, or the like, and then, a second distribution layer 112b and a first via 113a may be formed in an electrolytic and/or electroless plating process. Next, one or more dummy structures 125 may be disposed on the first insulating layer 111a.

Figure 14B:
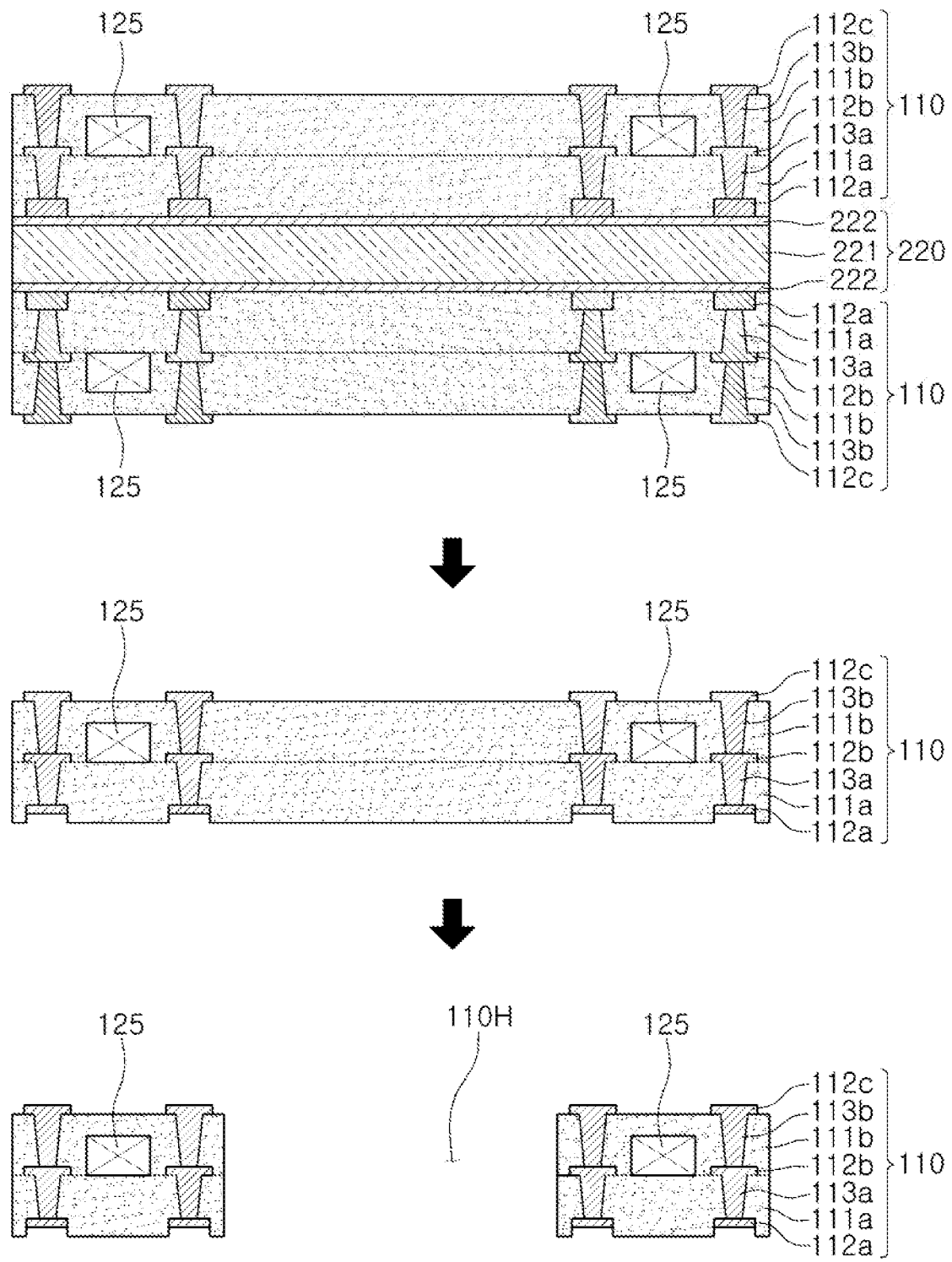

Referring to FIG. 14B, a second insulating layer 111b may be formed on the first insulating layer 111a using a laminating method or a coating method, to cover the dummy structures 125 and the like, a hole may be formed in the second insulating layer 111b using laser drilling and/or mechanical drilling and/or sand blasting, or the like, and then, a third distribution layer 112c and a second via 113b may be formed in an electrolytic and/or electroless plating process. Next, a core member 110 manufactured from the carrier substrate 220 may be separated therefrom. Separating the core member 110 may correspond to an operation in which the copper foil 222 comprised of a plurality of layers is separated. After the separation, the copper foil 222 remaining on a lower surface of the first insulating layer 111a may be removed by etching. At this time, a lower side of the first distribution layer 112a may be partially removed, in such a manner that a lower surface of the first insulating layer 111a and a lower surface of the first distribution layer 112a may have a step therebetween. Next, a through hole 110H may be formed in the core member 110. The through hole 110H may be formed using laser drilling and/or mechanical drilling and/or sand blasting, or the like.

Figure 14C:
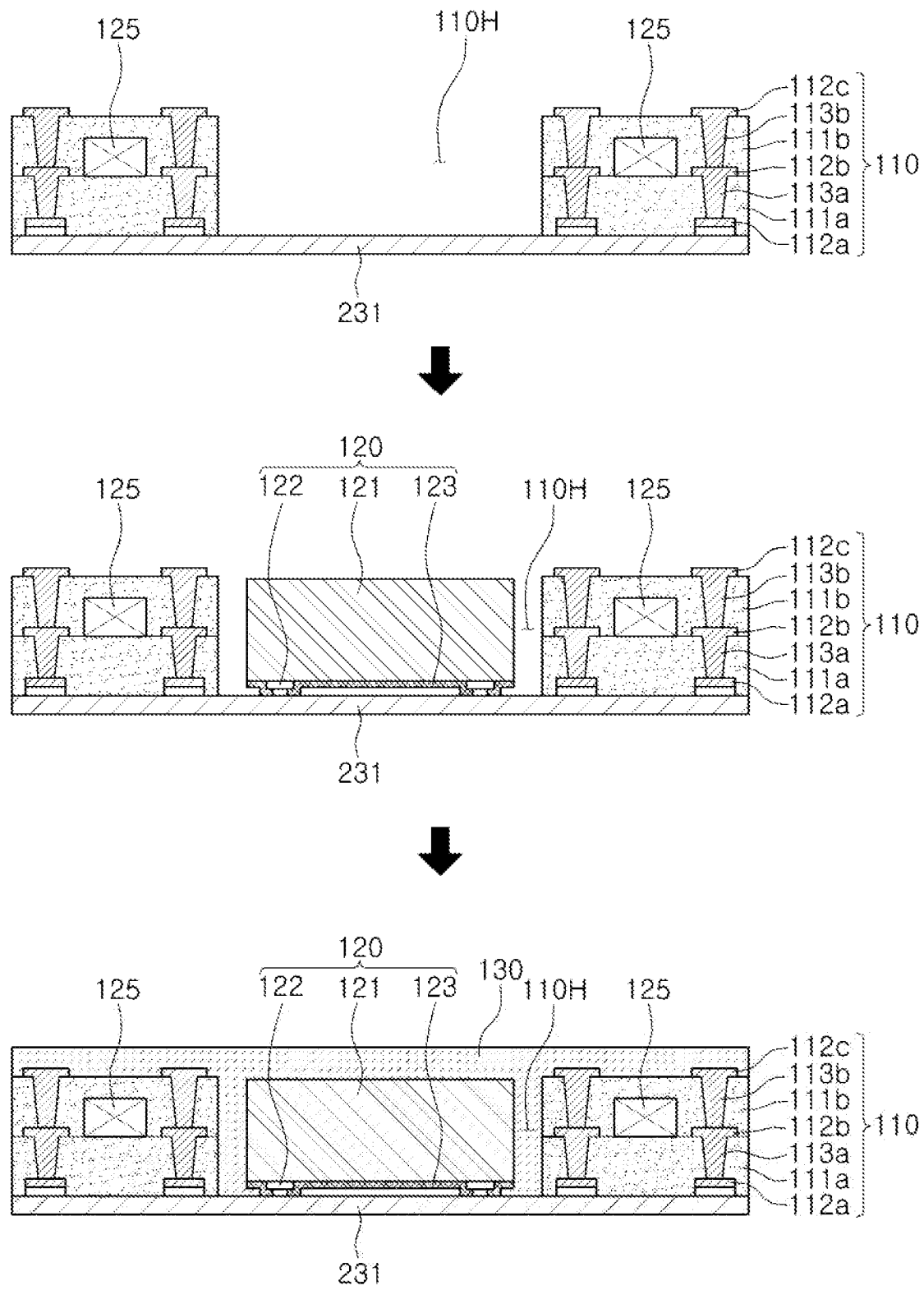

Referring to FIG. 14C, an adhesive film 231 may be attached to a lower side of the core member 110. The adhesive film 231 may be a tape or the like, including an epoxy resin. Next, a semiconductor chip 120 may be attached to the adhesive film 231 of the through hole 110H in a face-down manner. Next, an encapsulant 130 may be formed on the adhesive film 231 by a laminating method, a coating method, or the like, to seal the semiconductor chip 120 and the like.

Figure 14D:
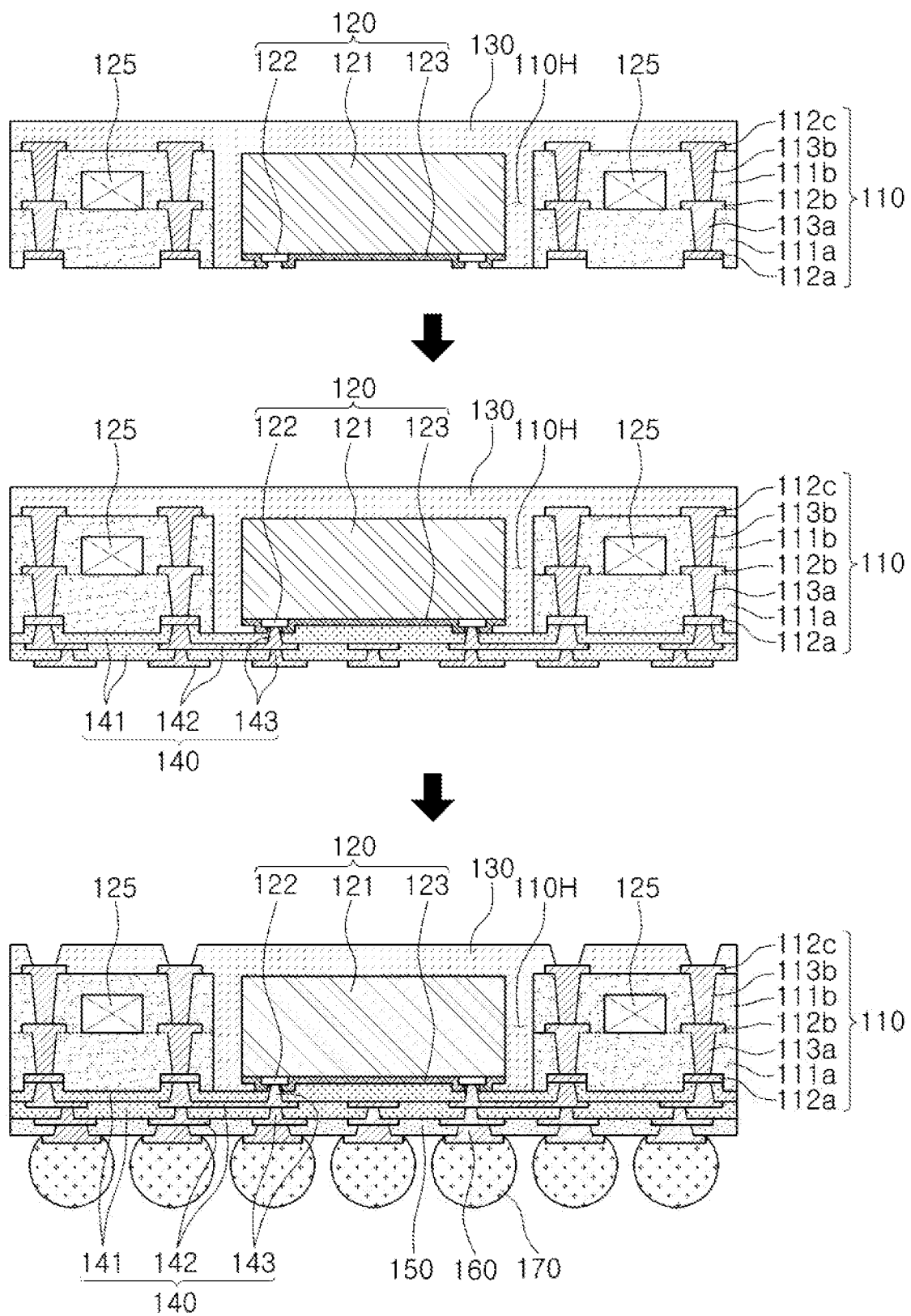

Referring to FIG. 14D, next, the adhesive film 231 may be removed. Then, a connection member 140 may be formed on a lower side of the core member 110 from which the adhesive film 231 has been removed. The connection member 140 may be formed by forming an insulating layer 141 using a PID lamination method or a coating method, forming a via hole in the insulating layer 141 using a photolithography method, and forming a redistribution layer 142 and a via 143 using electrolytic plating or electroless plating. Then, a passivation layer 150, an under-bump metal layer 160, an electrical connection structure 170, and the like may be formed on the connection member 140, in a manner known in the art, as required. Further, an opening may be formed in an upper portion of the encapsulant 130. On the other hand, a series of processes may be performed at a panel level, and in this case, when a dicing process is modified, a plurality of the fan-out semiconductor packages 100B may be manufactured in a single process.

Figure 15:
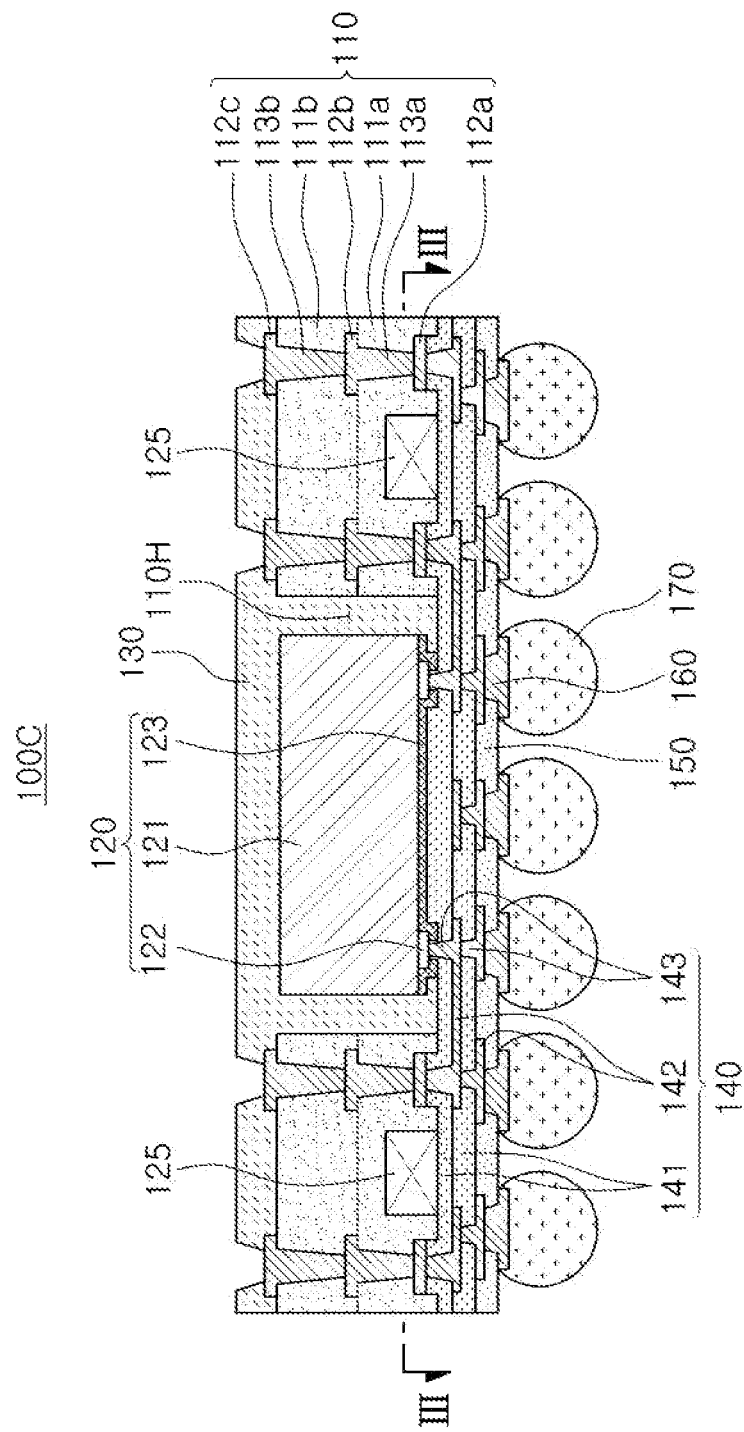
FIG. 15 is a schematic cross-sectional view of another example of a fan-out semiconductor package.

FIG. 15 is a schematic cross-sectional view of another example of a fan-out semiconductor package.

Figure 16:
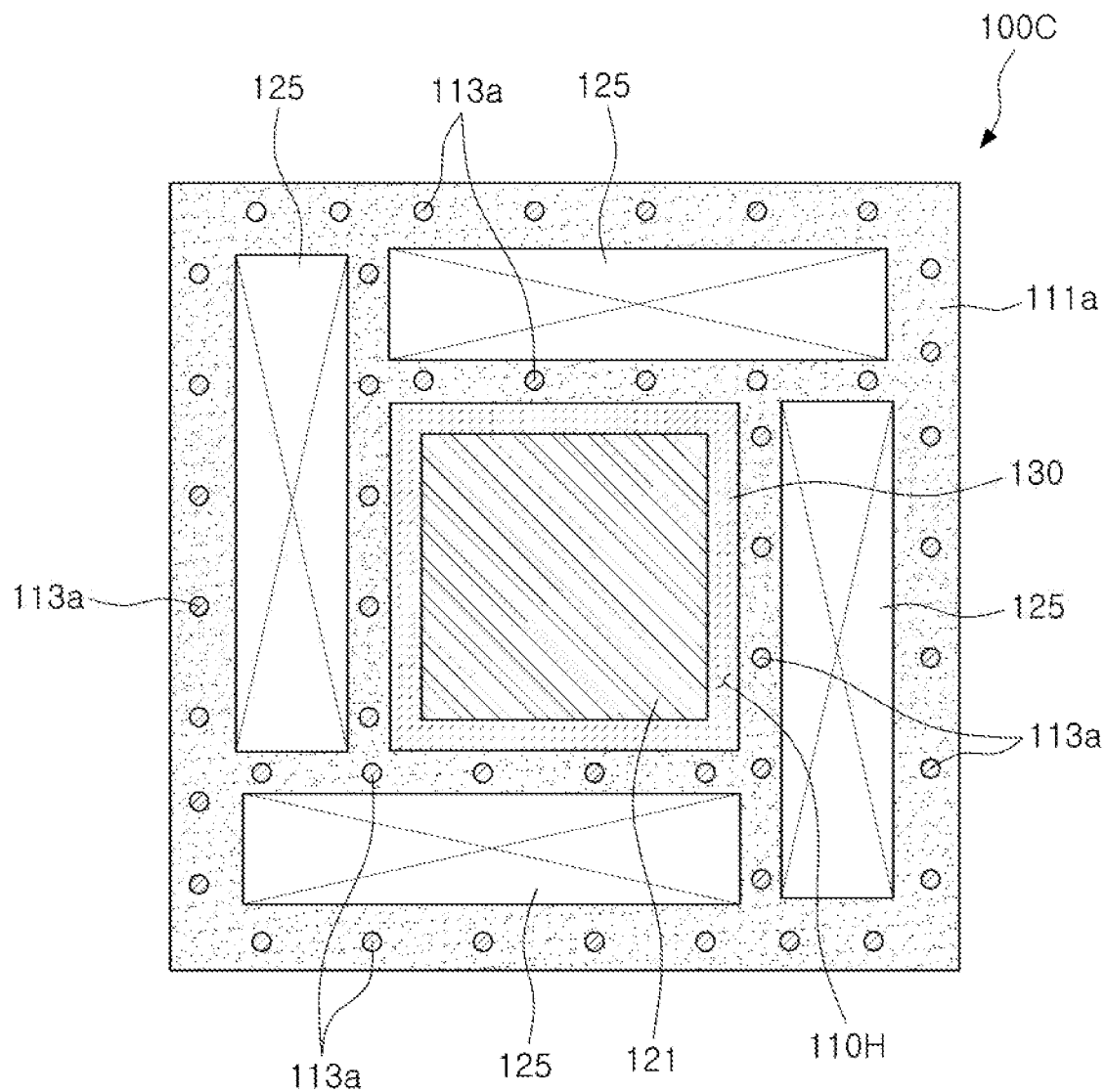
FIG. 16 is a schematic cutaway plan view of the fan-out semiconductor package, taken along line III-III' of FIG. 15.

FIG. 16 is a schematic cutaway plan view of the fan-out semiconductor package, taken along line III-III' of FIG. 15.

Referring to FIGS. 15 and 16, in a fan-out semiconductor package 100C according to another example, in a manner similar to the fan-out semiconductor package 100B according to the foregoing example, a core member 110 may include a first insulating layer 111a, a first distribution layer 112a embedded in the first insulating layer 111a in such a manner that a lower surface of the first distribution layer 112a is exposed, a second distribution layer 112b disposed on a side of the first insulating layer 111a, opposing a side of the first insulating layer 111a in which the first distribution layer 112a is embedded, a second insulating layer 111b disposed on the first insulating layer 111a and covering the second distribution layer 112b, and a third distribution layer 112c disposed on the second insulating layer 111b. The first to third distribution layers 112a, 112b and 112c may be electrically connected to a connection pad 122. The first and second distribution layers 112a and 112b, and the second and third distribution layers 112b and 112c, may be electrically connected to each other, through first and second vias 113a and 113b penetrating through the first and second insulating layers 111a and 111b, respectively.

On the other hand, in the case of a dummy structure 125, the dummy structure 125 may be disposed on the connection member 140 and may be covered with the first insulating layer 111a. For example, the dummy structure 125 may be embedded in the first insulating layer 111a in a manner in which one surface thereof is exposed.

Other configurations are substantially the same as those described above with respect to the fan-out semiconductor packages 100A and 100B, and the like, and thus, detailed descriptions will be omitted.

As set forth above, according to an exemplary embodiment, a fan-out semiconductor package having a novel structure, in which a warpage problem may be effectively solved, may be provided.

In the present disclosure, the lower side, the lower side, the lower surface, and the like refer to a direction toward a mounting surface of the fan-out semiconductor package, based on a cross section of the drawing for convenience, and the upper side, the upper portion, the upper surface and the like are used in the opposite direction. However, such descriptions are merely for the sake of convenience of description, and the scope of claims is not particularly limited by the description of such directions.

The meaning of being connected in the present disclosure encompasses not only a direct connection, but also includes an indirect connection through an adhesive layer or the like. In addition, the term "electrically connected" means a concept including both a physical connection and non-connection. Further, the expressions of the first, second, and the like are used to distinguish one component from another, and do not limit the order and/or importance of the components. In some cases, without departing from the scope of the present disclosure, a first component may be referred to as a second component, and similarly, a second component may be referred to as a first component.

The expression, an example, used in this disclosure does not mean the same embodiment, but is provided for emphasizing and explaining different unique features. However, the above-mentioned examples do not exclude being implemented in combination with the features of other examples. For example, although the description in the specific example is not described in another example, it may be understood as an explanation related to another example, unless otherwise described or contradicted by the other example.

The terms used in this disclosure are only used to illustrate an example and are not intended to limit the present disclosure. The singular expressions include plural expressions unless the context clearly dictates otherwise.

While example embodiments have been shown and described above, it will be apparent to those skilled in the art that modifications and variations could be made without departing from the scope of the present disclosure as defined by the appended claims.

What is claimed is:

1. A semiconductor package comprising:
a connection member including a redistribution layer;
a semiconductor chip disposed on an upper surface of the connection member, and including an active surface on which a connection pad is disposed and an inactive surface opposing the active surface, the connection pad is electrically connected to the redistribution layer;
an encapsulant sealing at least a portion of the semiconductor chip;
a plurality of conductive structures disposed on a periphery of the semiconductor chip, extending in a direction perpendicular to the upper surface of the connection member within the encapsulant, and having one ends connected to the redistribution layer and other ends opposite to the one ends; and
at least one dummy structure disposed between first and second conductive structures adjacent to each other, among the plurality of conductive structures, and electrically insulated from the semiconductor chip and the plurality of conductive structures,
wherein the at least one dummy structure includes silicon,
wherein the at least one dummy structure is positioned on a lower level than the other ends of the plurality of conductive structures, and
wherein a maximum width of the at least one dummy structure is smaller than a separation distance between the first and second conductive structures.

2. The semiconductor package of claim 1, wherein the at least one dummy structure is provided as a plurality of dummy structures surrounding side surfaces of the semiconductor chip.

3. The semiconductor package of claim 2, wherein the at least one dummy structure comprises a plurality of dummy structures, and the encapsulant is interposed between the plurality of dummy structures.

4. The semiconductor package of claim 2, wherein the at least one dummy structure comprises a plurality of dummy structures, and at least a portion of the plurality of conductive structures is interposed between the semiconductor chip and each of the plurality of dummy structures.

5. The semiconductor package of claim 1, wherein the first at least one dummy structure comprises a silicon piece.

6. The semiconductor package of claim 1, wherein the at least one dummy structure is positioned on a level between the one ends and the other ends of the plurality of conductive structures.

7. The semiconductor package of claim 1, wherein the at least one dummy structure is spaced apart from the upper surface of the connection member.

8. The semiconductor package of claim 1, wherein the at least one dummy structure is in contact with the upper surface of the connection member.

9. The semiconductor package of claim 1, further comprises an insulating layer disposed on the upper surface of the connection member, and covered by the encapsulant, and the plurality of conductive structures penetrate at least a portion of the insulating layer.

10. The semiconductor package of claim 9, wherein the encapsulant and the insulating layer include different insulating materials.

11. The semiconductor package of claim 9, wherein the at least one dummy structure is embedded in the insulating layer.

12. The semiconductor package of claim 11, when the insulating layer, and the at least one dummy structure are cut into planes parallel to the inactive surface of the semiconductor chip, a sum of planar areas of the at least one dummy structure is greater than a planar area of the insulating layer.

13. The semiconductor package of claim 1, wherein at least a portion of the other ends of the plurality of conductive structures is exposed from the encapsulant.

14. The semiconductor package of claim 1, wherein an arrangement of the semiconductor chip, and the at least one dummy structure is configured to reduce a package-level warpage.

15. The semiconductor package of claim 1, the semiconductor package is a fan-out semiconductor package, and the fan-out semiconductor package is configured to reduce a package-level warpage through a similarity of a first thermal expansion coefficient of the semiconductor chip and a second thermal expansion coefficient of the at least one dummy structure.

16. The semiconductor package of claim 1, wherein the at least one dummy structure is disposed in a fan-out region that does not overlap the semiconductor chip in the direction perpendicular to the upper surface of the connection member.

17. The semiconductor package of claim 1, further comprising:
a passivation layer disposed on the connection member and having an opening exposing at least a portion of the redistribution layer;
an under-bump metal layer disposed on the opening of the passivation layer, and electrically connected to the exposed at least a portion of the redistribution layer; and
an electrical connection structure disposed on the passivation layer, and connected to the under-bump metal layer to be electrically connected to the exposed at least a portion of the redistribution layer.

18. A semiconductor package comprising:
a connection member including a redistribution layer;
a semiconductor chip disposed on an upper surface of the connection member, and including an active surface on which a connection pad is disposed and an inactive surface opposing the active surface, the connection pad is electrically connected to the redistribution layer;
an encapsulant sealing at least a portion of the semiconductor chip;
a plurality of conductive structures disposed on a periphery of the semiconductor chip, extending in a direction perpendicular to the upper surface of the connection member within the encapsulant, and having one ends connected to the redistribution layer and other ends opposite to the one ends; and a plurality of dummy structures disposed on the periphery of the semiconductor chip, and electrically insulated from the semiconductor chip and the plurality of conductive structures, wherein the plurality of dummy structures are arranged to offset from each other a plurality of warpages occurring locally in a region of the semiconductor package, and wherein the plurality of dummy structures is spaced apart from the plurality of conductive structures.

19. The semiconductor package of claim 18, wherein the plurality of dummy structures are symmetrically arranged around the semiconductor chip.

20. A semiconductor package comprising:

a connection member including a redistribution layer;

a semiconductor chip disposed on an upper surface of the connection member, and including an active surface on which a connection pad is disposed and an inactive surface opposing the active surface, the connection pad is electrically connected to the redistribution layer;

an insulating layer disposed on the upper surface of the connection member;

a plurality of conductive structures disposed on a periphery of the semiconductor chip, extending in a direction perpendicular to the upper surface of the connection member within the insulating layer, and having one ends connected to the redistribution layer and other ends opposite to the one ends; and a plurality of dummy structures embedded in the insulating layer, and electrically insulated from the semiconductor chip and the plurality of conductive structures, wherein upper surfaces of the plurality of dummy structures are covered by the insulating layer, wherein the plurality of dummy structures includes semiconductor material, wherein the insulating layer includes a material different from the plurality of dummy structures, and wherein the insulating layer is disposed between at least one of the plurality of dummy structures and at least one of the plurality of conductive structures, adjacent to each other.

* * * * *